(12) United States Patent
Hatwar et al.

(10) Patent No.: US 6,875,524 B2
(45) Date of Patent: Apr. 5, 2005

(54) WHITE LIGHT-EMITTING DEVICE WITH IMPROVED DOPING

(75) Inventors: Tukaram K. Hatwar, Penfield, NY (US); Ralph H. Young, Rochester, NY (US); Christopher T. Brown, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/644,245

(22) Filed: Aug. 20, 2003

(65) Prior Publication Data

US 2005/0048311 A1 Mar. 3, 2005

(51) Int. Cl.[7] ............................................. H05B 33/14
(52) U.S. Cl. ...................... 428/690; 428/917; 257/88; 257/98; 313/504; 313/506
(58) Field of Search ................ 428/690, 917; 257/88, 98; 313/504, 506

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,405,709 A | 4/1995 | Littman et al. | |
| 5,683,823 A | 11/1997 | Shi et al. | |
| 2003/0170496 A1 * | 9/2003 | Hieda et al. | 428/690 |

FOREIGN PATENT DOCUMENTS

JP 07-142169 2/1995

OTHER PUBLICATIONS

"White light–emitting organic electroluminescent devices using the poly(N–vinylcarbazole) emitter layer doped with three fluorescent dyes" by J. Kido et al., Applied Physics letter 64 (7), Feb. 14, 1994, p. 615–617.

"Multilayer White Light–emitting Organic Electroluminescent Device" by J. Kido et al., Science, vol. 267, Mar. 3, 1995, p. 1332–1334.

"White–light–emitting organic electroluminescent devices based on interlayer sequential energy transfer" by R. S. Deshpande et al., Applied Physics letters, vol. 75, No. 7, Aug. 16, 1999, p. 888–890.

* cited by examiner

Primary Examiner—Dawn Garrett
(74) Attorney, Agent, or Firm—Raymond L. Owens

(57) ABSTRACT

Organic light-emitting diodes (OLEDs) that produce white light include an anode, a hole-transporting layer disposed over the anode, a blue light-emitting layer disposed over the hole-transporting layer, an electron-transporting layer disposed over the blue light-emitting layer, and a cathode disposed over the electron-transporting layer. The hole-transporting layer is doped with both a yellow-emitting and a red-emitting dopant. When used together with red, green, and blue color filters, the OLEDs produce red, green, and blue light with good color quality and high efficiency. Also disclosed are multicolor display devices utilizing the OLEDs together with color filters or together with both color filters and liquid-crystal light valves.

46 Claims, 6 Drawing Sheets

WHITE LIGHT-EMITTING DEVICE WITH IMPROVED DOPING

CROSS REFERENCE TO RELATED APPLICATIONS

Reference is made to commonly assigned U.S. patent application Ser. No. 09/651,624 filed Aug. 30, 2000, now U.S. Pat. No. 6,696,177, by Tukaram K. Hatwar, entitled "White Organic Electroluminescent Devices with Improved Stability and Efficiency"; Ser. No. 09/930,050 filed Aug. 15, 2001, now U.S. Pat. No. 6,627,333, by Tukaram K. Hatwar, entitled "White Organic Electroluminescent Devices with Improved Efficiency"; Ser. No. 10/191,251 filed Jul. 8, 2002, now U.S. Pat. No. 6,720,092, by Tukaram K. Hatwar, entitled "White Organic Light-Emitting Devices Using Rubrene Layer"; Ser. No. 10/183,242 filed Jun. 27, 2002, now U.S. Pat. No. 6,661,023 by Benjamin P. Hoag et al., entitled "Organic Element for Electroluminescent Devices"; Ser. No. 10/086,067 filed Feb. 28, 2002, now U.S. Pat. No. 6,824,893 by Benjamin P. Hoag et al., entitled "Organic Element for Electroluminescent Devices"; and Ser. No. 10/889,931 filed Jul. 13, 2004 is a continuation of Ser. No. 10/184,356 filed Jun. 27, 2002, now abandoned, by Lelia Cosimbescu, entitled "Device Containing Green Organic Light-Emitting Diode", the disclosures of which are incorporated herein.

FIELD OF THE INVENTION

The present invention relates to organic light-emitting diode devices that produce white light.

BACKGROUND OF THE INVENTION

Organic light-emitting diodes (OLEDs) are attractive devices because of their low driving voltage, high luminance, wide-angle viewing and capability for full-color flat emission displays. Tang et al. described a multilayer OLED in their U.S. Pat. Nos. 4,769,292 and 4,885,211. OLEDs that produce white light (white OLEDs) efficiently are considered a low cost alternative for several applications such as paper-thin light sources, backlights in liquid crystal displays (LCDs), automotive dome lights, and office lighting. As with any light-emitting device, it is desirable that white OLEDs be bright and efficient in terms of power consumption. The preferred spectrum and precise color of a white OLED will depend on the application for which it is intended. For example, if a particular application requires light that is to be perceived as white without subsequent processing that alters the color perceived by a viewer, it is desirable that the light emitted by the OLED have 1931 Commission International d'Eclairage (CIE) chromaticity coordinates, (CIEx, CIEy), of about (0.33, 0.33). For other applications, particularly applications in which the light emitted by the OLED is subjected to further processing that alters its perceived color, it can be satisfactory or even desirable for the light that is emitted by the OLED to be off-white, for example bluish white, greenish white, yellowish white, or reddish white. Hereinafter, the term "white" will be used broadly to mean light that is perceived as white or off-white. The CIE coordinates of such light satisfy, at least approximately, the condition that the quantities (CIEx+ 0.64 CIEy) and (0.64 CIEx–CIEy) be in the range of 0.36 to 0.76 and the range of –0.20 to +0.01, respectively. A white OLED will mean an OLED whose emission is white in this broad sense.

The following patents and publications disclose OLEDs capable of emitting white light, comprising a hole-transporting layer and an organic luminescent layer, and interposed between two electrodes. White OLEDs have been reported before by J. Shi in U.S. Pat. No. 5,683,823, wherein the luminescent layer includes red and blue light-emitting materials uniformly dispersed in a host emitting material. These devices have good electroluminescent characteristics, but the concentrations of the red and blue dopants are very small, such as 0.12% and 0.25% of the host material. These concentrations are difficult to control during large-scale manufacturing. Sato et al., in JP 07,142,169, disclose an OLED capable of emitting white light, made by forming a blue light-emitting layer adjacent to a hole-transporting layer, followed by a green light-emitting layer having a region containing a red fluorescent dye. Kido et al., in Applied Physics Letters Vol., 64, p. 815 (1994), report a white OLED in which a single light-emitting layer contains a polymeric host and three fluorescent dyes emitting in different spectral regions. Kido et al., in Science, Vol. 267, p. 1332 (1995), report another white OLED. In this device, three light-emitting layers with different carrier transport properties, and individually emitting blue, green or red light, are used to generate white light. Littman et al., in U.S. Pat. No. 5,405,709, disclose another white OLED that includes an electron-transporting layer doped with a red dopant and also includes a blue light-emitting recombination layer contiguous with a hole-injecting and hole-transporting zone. Deshpande et al., in Applied Physics Letters, Vol. 75, p. 888 (1999), describe a white OLED using one layer with green luminescence and a second layer with red and blue luminescence, the two layers being separated by a hole blocking layer.

White OLEDs can be used with color filters in full-color display devices. They can also be used with color filters in other multicolor or functional-color display devices. White OLEDs for use in such display devices are easy to manufacture, and they produce reliable white light in each pixel of the displays. However, the color filters each transmit only about 30% of the original white light. Therefore, the white OLEDs must have high luminous yield. Although the OLEDs are referred to as white and can appear white or off-white, for this application, the CIE coordinates of the light emitted by the OLED are less important than the requirement that the spectral components passed by each of the color filters be present with sufficient intensity in that light. It is also important that the color, after passage through a color filter, be appropriate for the intended application. For use in a full-color display, typical desired colors after passage through a red, green, or blue filter are, respectively, red with CIE coordinates of about (0.64, 0.36), green with CIE coordinates of about (0.29, 0.67), and blue with CIE coordinates of about (0.15, 0.19). The devices must also have good stability in long-term operation. That is, as the devices are operated for extended periods of time, the luminance of the devices should decrease as little as possible.

A problem in the application of white OLEDs, when used with color filters, is that the intensity of the red component of the emission spectrum is frequently lower than desired. Therefore, passing the white light from the OLED through the red filter provides red light with a lower efficiency than desired, and the power that is required to provide a desired intensity of red light is higher than desired. Consequently, the power that is required to produce a white color in the display by mixing red, green, and blue light can also be higher than desired.

SUMMARY OF THE INVENTION

It is an object of the present invention to produce a white OLED that, when used with a red filter, produces red light with improved efficiency and color purity.

This object is achieved by providing an organic light-emitting diode (OLED) device that produces white light, including:

a) an anode;

b) a hole-transporting layer disposed over the anode;

c) a blue light-emitting layer disposed over the hole-transporting layer;

d) an electron-transporting layer disposed over the blue light-emitting layer;

e) a cathode disposed over the electron-transporting layer; and f) the hole-transporting layer including a host material, a yellow dopant, and a red dopant.

It has been found, quite unexpectedly, that the red light produced by a white OLED with a red filter can be increased in intensity and improved in saturation by including in the OLED both a blue light-emitting layer and a hole-transporting layer that includes a host material, a yellow dopant, and a red dopant.

ADVANTAGES

The following are features and advantages of the present invention.

Full-color displays using white OLEDs constructed according to the present invention together with suitable color filters have an improved intensity of the red component.

Full-color displays using white OLEDs constructed according to the present invention together with suitable color filters have a reduced power requirement for the red pixels.

Full-color displays using white OLEDs constructed according to the present invention together with suitable color filters have an improved color purity of the red component.

The OLEDs constructed according to the present invention have high operational stability.

OLED devices constructed according to the present invention can be produced consistently and with high reproducibility to provide high efficiency, low drive voltage, and good stability.

DETAILED DESCRIPTION OF THE INVENTION

Figure 1:
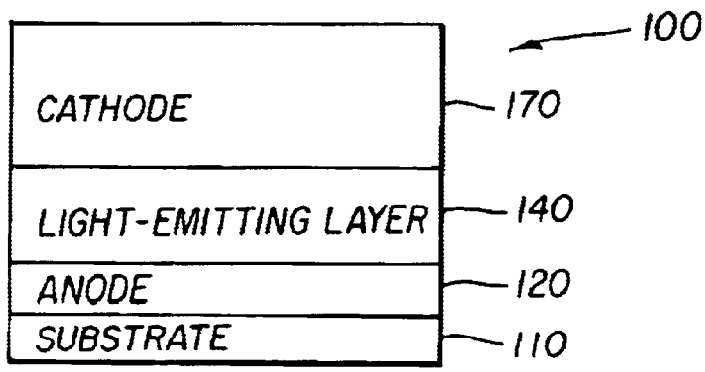
FIG. 1 depicts a prior art OLED.

A conventional OLED includes an organic light-emitting layer together with electrical contacts that are capable of injecting electrons and holes into that layer. The organic light-emitting layer includes a material that is luminescent (that is, fluorescent or phosphorescent) and a material that is capable of transporting both electrons and holes. Light emission, known as electroluminescence (EL), is produced as a result of electron-hole pair recombination in this layer. In the simplest construction, the OLED 100 as shown in FIG. 1 has a substrate 110 and an organic light-emitting layer 140 sandwiched between anode 120 and cathode 170. The light-emitting layer 140 can be a single pure organic or organometallic material with a high luminescent efficiency. A well known material, suitable for this application, is tris(8-quinolinolato)aluminum(III) (Alq), which produces excellent green electroluminescence. Alternatively, the light-emitting layer 140 can include a host material that is capable of transporting both electrons and holes, and relatively small amounts of one or more luminescent dyes as dopants. Energy liberated by the recombination of electrons and holes is converted to visible radiation by the dopants.

An OLED can be considered as a diode, which is forward biased when the anode is at a higher potential than the cathode. Generally, an OLED is capable of transporting a large current density, equal to or exceeding 20 mA/cm$^2$, when forward biased, but transports only a very small current density, much less than one $\mu$A/cm$^2$, when reverse biased.

Figure 2:
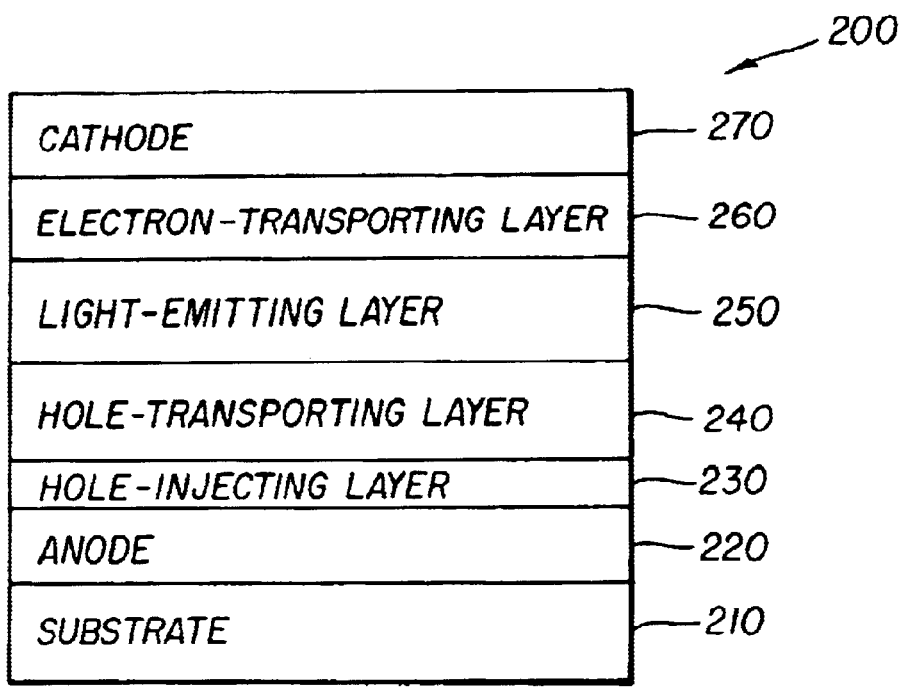
FIG. 2 depicts another prior art OLED.

The simple structure of OLED 100 can be modified to a three-layer structure (device 200) as shown in FIG. 2, in which the light-emitting layer is situated between organic hole- and electron-transporting layers. The light-emitting layer functions primarily as the site for hole-electron recombination and thus electroluminescence. The additional layers serve to transport holes and electrons from the anode and the cathode, respectively, to the light-emitting layer. In this structure, the functions of the individual organic layers are distinct and can therefore be optimized independently. Thus, the light-emitting layer can be chosen to produce a desirable color of emission as well as high luminous yield. Likewise, the electron-transporting and hole-transporting layers can be optimized primarily for their carrier transport properties.

In FIG. 2, the organic light-emitting device 200 has a light-transmissive substrate 210 on which is disposed a light-transmissive anode 220. An organic light-emitting structure is formed between the anode 220 and a cathode 270. The organic light-emitting structure is comprised of, in sequence, a transparent organic hole-transporting layer 240, an organic light-emitting layer 250, and an organic electron-transporting layer 260. Layer 230 is an optional hole-injecting layer. When an electrical potential difference (not shown) is applied between the anode 220 and the cathode 270, the cathode will inject electrons into the electron-transporting layer 260, and the electrons will migrate across layer 260 to the light-emitting layer 250. At the same time, holes will be injected from the anode 220 into the hole-transporting layer 240 or the optional hole-injecting layer 230. The holes will migrate across layer 230, if it is present, and across layer 240 and recombine with electrons in the light-emitting layer or at the junction formed between the hole-transporting layer 240 and the light-emitting layer 250. The recombination events release energy, which is emitted as light through the light-transmissive anode 220 and substrate 210. Alternatively, the electron-transporting layer and the cathode can be chosen to be transparent, thus facilitating emission of light through the cathode rather than through the substrate.

A preferred embodiment of the organic light-emitting layer includes of a host material doped with one or more luminescent dyes. Using such doped light-emitting layers, highly efficient EL devices can be constructed. Simultaneously, the color of the emitted light can be tuned by using luminescent dyes having different emission spectra in a common host material or in different host materials. Tang et al., in commonly assigned U.S. Pat. No. 4,769,292, have described this dopant scheme in considerable detail for EL devices using Alq as the host material. Shi et al., in commonly assigned U.S. Pat. No. 5,935,721, have described this dopant scheme in considerable detail for blue-emitting OLEDs using 9,10-di-(2-naphthyl)anthracene (ADN) and its derivatives as host materials.

A full-color or multicolor display device can be constructed with an array or a plurality of OLEDs with different emission colors, typically red, green, and blue. This construction requires the fabrication of OLEDs of differing composition in the differently colored pixels.

An alternative full-color or multicolor display device can be constructed using white OLEDs of a single composition, combined with red, green, and blue (RGB) color filters, that is, filters that transmit red, green, or blue light. The RGB filters can be deposited on the substrate (when light transmission is through the substrate), incorporated into the substrate, or deposited over the top electrode (when light transmission is through the top electrode). Each color filter corresponds to a different OLED. When electrical current is driven through an individual OLED, the OLED produces white light, which is filtered by the color filter to produce red, green, or blue light. When depositing a RGB filter array over the top electrode, a buffer layer can be used to protect the top electrode. The buffer layer can comprise inorganic materials, for example, silicon oxides and nitrides, or organic materials, for example, polymers, or multiple layers of inorganic and organic materials. Methods for providing RGB filter arrays are well known in the art. Lithographic means, inkjet printing, and laser thermal transfer are just a few of the methods by which RGB filters can be provided.

This technique of producing a full-color display using white light plus RGB filters has several advantages over the precision shadow masking technology used for producing full-color displays. This technique does not require precision alignment, is low-cost, and is relatively easy to manufacture. The substrate itself typically also contains thin-film transistors (TFTs) to address the individual pixels. U.S. Pat. Nos. 5,550,066 and 5,684,365 to Ching et al. describe the addressing methods of the TFT substrates.

Another alternative full-color or multicolor display device can be constructed by using one or more white OLEDs as backlight(s) for a liquid-crystal display. In such a device, upon passage of electrical current through the OLED(s), the OLED(s) supplies light of constant intensity and constant spectrum, the color of each pixel is controlled by a color filter, and the brightness of each pixel is controlled by a liquid-crystal light-valve. Thus, the display device includes one or more white OLEDs; an array of color filters typically including red, green, and blue filters disposed such that the white light produced by the OLED(s) is filtered by the color filters to produce colored light; and an array of liquid-crystal light valves, each light valve corresponding to a different color filter, such that the white light produced by the OLED(s) and filtered by the color filter is adjusted in brightness by the liquid-crystal light valve.

OLEDs constructed according to the present invention are illustrated in FIGS. 3–6. Any of these OLEDs can be used together with suitable color filters to construct a color display device.

Figure 3:
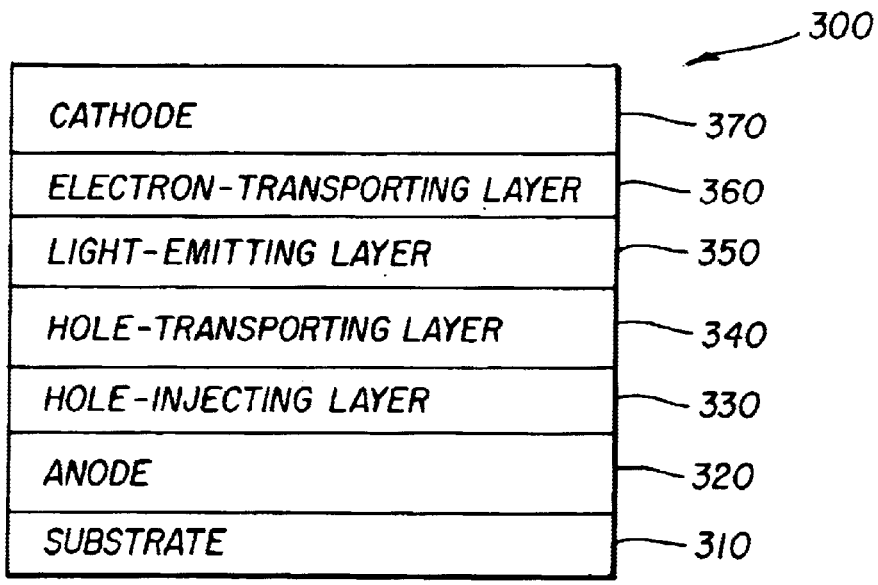
FIG. 3 depicts a white OLED constructed according to the present invention.

One white OLED constructed according to the present invention is illustrated in FIG. 3. The white OLED 300 has a light-transmissive substrate 310 on which is disposed a light-transmissive anode 320. An organic white-light-emitting structure is formed between the anode 320 and the cathode 370. That structure includes, in sequence, an optional hole-injecting layer 330, a hole-transporting layer 340, a blue light-emitting layer 350, and an organic electron-transporting layer 360. A blue light-emitting layer is a light-emitting layer that is constructed to emit blue light. It can include of either a single material or a combination of materials including a host, a blue dopant, and optionally one or more additional dopants. The hole-transporting layer 340 is doped simultaneously (codoped) with a yellow dopant and a red dopant. A blue, green, yellow, or red dopant is a dopant whose characteristic color of luminescence is blue, green, yellow, or red, respectively. For purposes of this disclosure, the term "blue" will be used broadly to mean violet-tinged blue, blue, or greenish blue; the term "yellow" will be used broadly to mean greenish yellow, yellow, yellowish orange, orangish yellow, or orange; and the term "red" will be used broadly to mean reddish orange, orangish red, or red.

Figure 4:
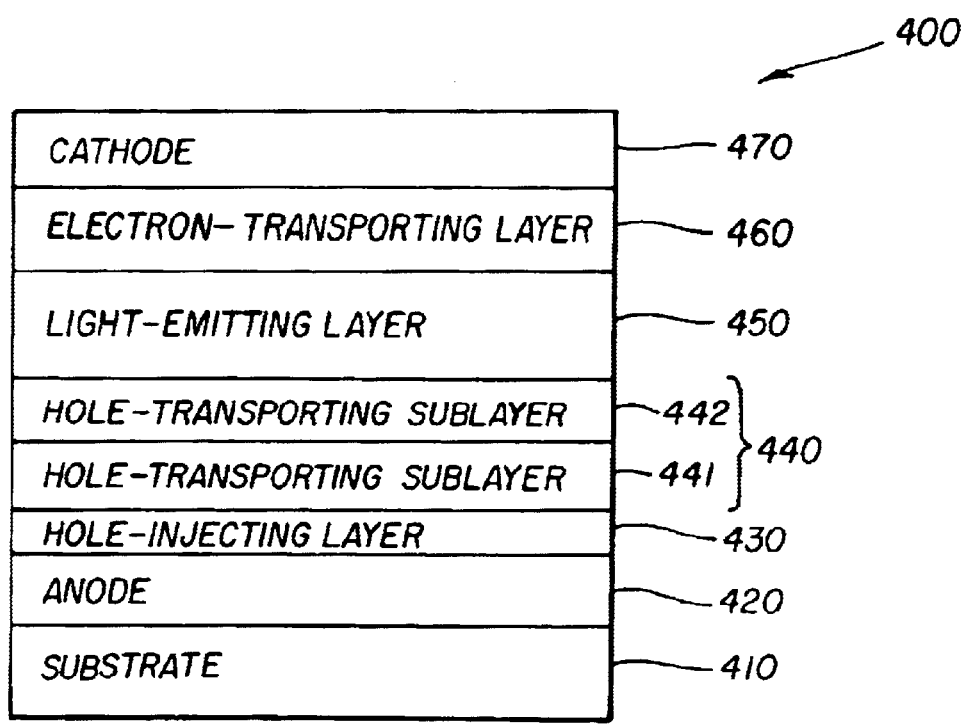
FIG. 4 depicts another white OLED constructed according to the present invention.

FIG. 4 depicts a white OLED 400, which is similar to that shown in FIG. 3, except that the organic hole-transporting layer 440 comprises two hole-transporting sublayers, 441 and 442. Sublayer 442, which is adjacent to the blue light-emitting layer 450, is codoped with a yellow dopant and a red dopant. Sublayer 441 is not necessarily codoped with both a yellow dopant and a red dopant. For example, sublayer 441 can contain no light-emitting dopant. Alternatively, sublayer 441 can be doped with one or more light-emitting dopants. Other layers of the structure 400 are substrate 410, anode 420, optional hole-injecting layer 430, electron-transporting layer 460, and cathode 470.

Figure 5:
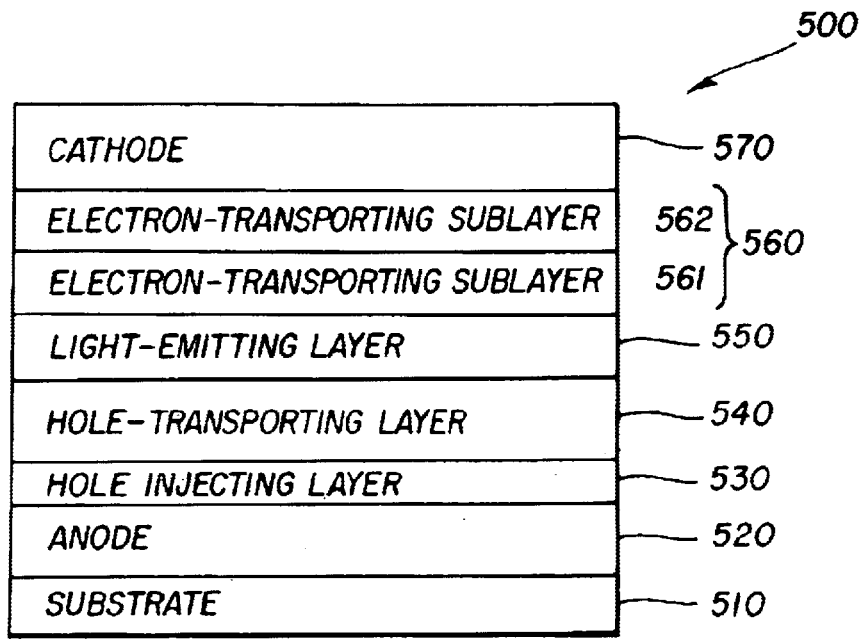
FIG. 5 depicts yet another white OLED constructed according to the present invention.
Figure 6:
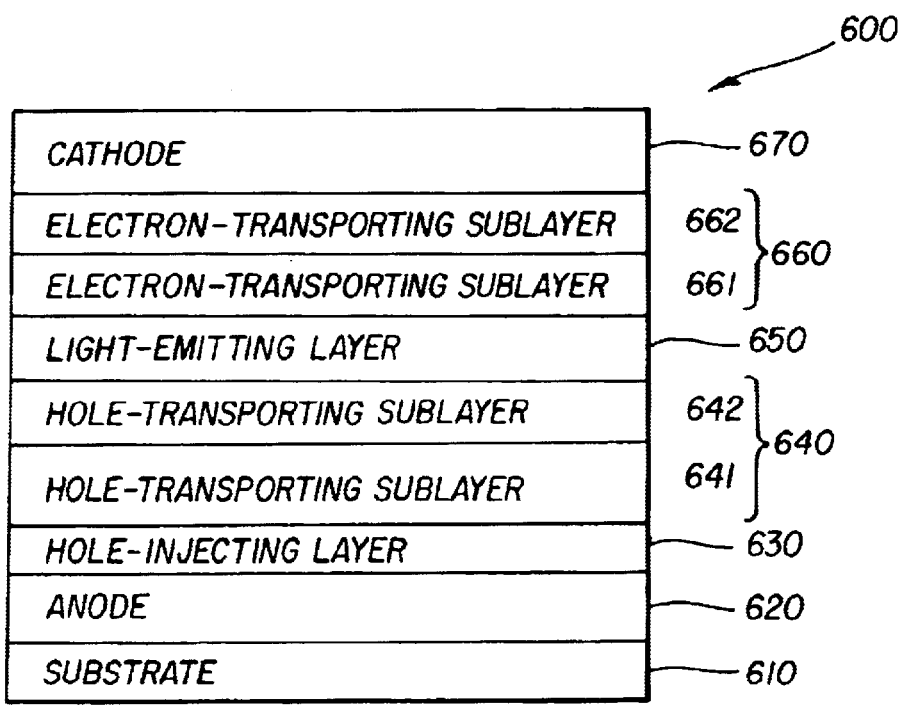
FIG. 6 depicts still another white OLED constructed according to the present invention.

The electron-transporting layer can also contain one or more light-emitting dopant(s). The entire electron-transporting layer can be doped with the light-emitting dopant(s). Alternatively, the electron-transporting layer can include two or more electron-transporting sublayers, with the light-emitting dopant(s) present in the electron-transporting sublayer that is adjacent to the blue light-emitting layer, and with the light-emitting dopant(s) absent from the electron-transporting sublayer that is adjacent to the cathode. FIG. 5 depicts an OLED 500 that is like OLED 300 in FIG. 3 except that the electron-transporting layer 560 is subdivided into electron-transporting sublayers 561 and 562. Sublayer 561 is adjacent to the blue light-emitting layer 550 and contains a light-emitting dopant, whereas sublayer 562 is adjacent to the cathode 570 and contains no light-emitting dopant. Other layers of the structure 500 are substrate 510, anode 520, optional hole-injecting layer 530, and hole-transporting layer 540. FIG. 6 depicts an OLED 600 that is like OLED 400 in FIG. 4 except that the electron-transporting layer 660 is subdivided into electron-transporting sublayers 661 and 662. Sublayer 661 is adjacent to the blue light-emitting layer 650 and contains a light-emitting dopant, whereas sublayer 662 is adjacent to the cathode 670 and contains no light-emitting dopant. Other layers of the structure 600 are substrate 610, anode 620, optional hole-injecting layer 630, hole-transporting layer 640, and hole-transporting sublayer 641, and codoped hole-transporting sublayer 642.

An OLED constructed according to the present invention is typically constructed over a supporting substrate, such as substrate 310 in FIG. 3. One electrode, either the anode or the cathode, can be in contact with the substrate. Alternatively, an additional layer, such as a color-filter layer, can be interposed between the substrate and the nearer electrode. The electrode that is nearer to the substrate is conveniently referred to as the bottom electrode, and the other electrode as the top electrode. Conventionally, the bottom electrode is the anode, as shown for example in FIG. 3, but the present invention is not limited to that configuration. If the bottom electrode is the cathode, the sequence of organic layers is reversed from that described above, and the anode is deposited over the hole-transporting layer or the optional hole-injecting layer.

The substrate can either be light-transmissive or opaque, depending on the intended direction of light emission. The light-transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore the substrate can be light-transmissive, light absorbing or light reflective. Substrates for use in this case include, but are not limited to, glass, plastic, semiconductor materials including silicon, ceramics, circuit board materials, and polished metal surfaces. Of course, it is necessary to provide in these device configurations a light-transparent top electrode.

Although the present invention has been described in terms of the specific structures shown in FIGS. 3–6, similar structures are within the scope of the invention. In particular, further subdivisions of the layers, additional dopants used for various purposes, and additional layers can be used within the spirit of the present invention. For example, very thin additional layers, doped or undoped, can be inserted between the light-emitting layer and the hole-transporting layer or the electron-transporting layer in order to modify the nature of the contact between them. The thickness of such layers is typically 5 nm or less. For another example, the hole-transporting layer or electron-transporting layer can contain an additional dopant in order to improve the operational stability of the device. For yet another example, an additional layer can be inserted between the electron-transporting layer and the cathode in order to facilitate the injection or transport of electrons.

The anode and cathode of the OLED can each take any convenient conventional form, such as any of the various forms disclosed by Tang et al. in U.S. Pat. No. 4,885,211. Operating voltage, also known as drive voltage, can be substantially reduced when using a low-work-function cathode and a high-work-function anode. The preferred cathodes are those constructed of a combination of a metal having a work function less than 4.0 eV and one other metal, preferably a metal having a work function greater than 4.0 eV. The Mg:Ag alloy of Tang et al., U.S. Pat. No. 4,885,211, constitutes one preferred cathode construction. Hung et al., in U.S. Pat. No. 5,776,622, have disclosed the use of a LiF/Al bilayer to enhance-electron injection in OLEDs. Cathodes made of either Mg:Ag or LiF/Al are usually opaque, and displays cannot be viewed through the cathode. A series of publications by Gu et al. in Applied Physics Letters, Vol. 68, p. 2606 (1996); Burrows et al., Journal of Applied Physics, Vol. 87, p. 3080 (2000); Parthasarathy et al., Applied Physics Letters, Vol. 72, p. 2138 (1998); Parthasarathy et al., Applied Physics Letters, Vol. 76, p. 2128 (2000); and Hung et al., Applied Physics Letters, Vol. 74, p. 3209 (1999) have disclosed transparent cathodes. These transparent cathodes are based on the combination of a thin semitransparent metal (~10 nm) and indium-tin-oxide (ITO) on top of the metal.

Conventionally, the anode is formed of a conductive and transparent metal oxide. Indium tin oxide has been widely used as the anode contact because of its transparency, good conductivity, and high-work function.

In a preferred embodiment, the anode, such as anode 320 in FIG. 3, can be modified with a hole-injecting layer such as anode 320 in FIG. 3. The hole-injecting layer can serve to improve the film formation properties of subsequent organic layers and to facilitate injection of holes into the hole-transporting layer. Suitable materials for use in the hole-injecting layer include, but are not limited to, porphyrinic compounds such as copper phthalocyanine (CuPc) as described in U.S. Pat. No. 4,720,432; plasma-deposited fluorocarbon polymers as described in U.S. Pat. No. 6,208,075; and certain aromatic amines such as m-MTDATA, alias 4,4',4"-tris[(3-methylphenyl)phenylamino]-triphenylamine. Alternative materials for use in hole-injecting layers in OLEDs are disclosed in EP 0 891 121 A1 and EP 1 029 909 A1.

An undoped hole-transporting layer or sublayer, or the host material of a doped or codoped hole-transporting layer or sublayer according to the present invention includes at least one hole-transporting compound such as an aromatic tertiary amine, where the latter is understood to be a compound containing at least one trivalent nitrogen atom that is bonded to three carbon atoms, at least one of which carbon atoms is a member of an aromatic ring. In one form, the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active-hydrogen-containing group are disclosed by Brantley et al. in U.S. Pat. Nos. 3,567,450 and 3,658,520.

A more preferred class of aromatic tertiary amines is compounds that include at least two aromatic tertiary amine moieties as described in U.S. Pat. Nos. 4,720,432 and 5,061,569. The hole-transporting layer can be formed of a single aromatic tertiary amine or a mixture of aromatic tertiary amines. Illustrative of useful aromatic tertiary amines is the following list:

1,1-Bis(4-di-p-tolylaminophenyl)cyclohexane
   1,1-Bis(4-di-p-tolylaminophenyl)-4-phenylcyclohexane
   N,N,N',N'-tetraphenyl-4,4'''-diamino-1,1':4',1":4",1'''-
     quaterphenyl Bis(4-dimethylamino-2-methylphenyl)phenylmethane
1,4-bis[2-[4-[N,N-di(p-toly)amino]phenyl]vinyl]benzene (BDTAPVB)
N,N,N',N'-Tetra-p-tolyl-4,4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl (NPB)
4,4'-Bis[N-(1-naphthyl)-N-(2-naphthyl)amino]biphenyl (TNB)
4,4'-Bis[N-(1-naphthyl)-N-phenylamino]-p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4'-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis {N-phenyl-N-[4-(1-naphthyl)phenyl]amino}biphenyl
2,6-Bis[N,N-di(2-naphthyl)amino]fluorene
4,4',4"-tris[(3-methylphenyl)phenylamino]triphenylamine (MTDATA)
4,4'-Bis[N-(3-methylphenyl)-N-phenylamino]biphenyl (TPD)

Tertiary aromatic amines with more than two amine groups can be used as hole-transporting compounds, including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS. Another class of useful hole-transporting materials includes polycyclic aromatic compounds as described in EP 1 009 041.

An undoped electron-transporting layer or sublayer, or the host material of a doped electron-transporting layer or sublayer of the present invention includes at least one electron-transporting material. Preferred electron-transporting materials are metal-chelated oxinoid compounds, including chelates of oxine itself (also commonly referred to as 8-quinolinol or 8-hydroxyquinoline) as disclosed in U.S. Pat. No. 4,885,211. Tris(8-quinolinolato) aluminum(III), also known as Alq, is one of the commonly used electron transporting materials. Such compounds exhibit high levels of performance and are readily fabricated in the form of thin layers. Some examples of useful electron-transporting materials are:

Aluminum trisoxine [alias, tris(8-quinolinolato) aluminum(III)]
Magnesium bisoxine [alias, bis(8-quinolinolato) magnesium(II)]
Bis[benzo{f}-8-quinolinolato]zinc (II)
Bis(2-methyl-8-quinolinolato)aluminum(III)-$\mu$-oxo-bis(2-methyl-8-quinolinolato) aluminum(III)
Indium trisoxine [alias, tris(8-quinolinolato)indium]
Aluminum tris(5-methyloxine) [alias, tris(5-methyl-8-quinolinolato) aluminum(III)]
Lithium oxine [alias, (8-quinolinolato)lithium(I)]
Gallium oxine [alias, tris(8-quinolinolato)gallium(III)]
Zirconium oxine [alias, tetra(8-quinolinolato)zirconium (IV)]

Related materials, denoted collectively as BAlq, can also be used as electron transporting materials. Bryan et al., in U.S. Pat. No. 5,141,671, discuss such materials. The BAlq compounds are mixed-ligand aluminum chelates, specifically bis($R_s$-8-quinolinolato)(phenolato)aluminum(III) chelates, where $R_5$ is a ring substituent of the 8-quinolinolato ring nucleus. These compounds are represented by the formula $(R_sQ)_2AlOL$, where Q represents a substituted 8-quinolinolato ligand, $R_s$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

A preferred embodiment of the blue light-emitting layer includes a host material doped with one or more blue dopants.

Host materials suitable for use with blue dopants include derivatives of anthracene having hydrocarbon or substituted-hydrocarbon substituents at the 9 and 10 positions, such as 9,10-diphenylanthracene and its derivatives, as described in U.S. Pat. No. 5,935,721. Derivatives of 9,10-di-(2-naphthyl)anthracene (Formula I) constitute a preferred class of hosts for use with blue dopants in the blue light-emitting layer. The general structure of these derivatives is shown below:

Formula I

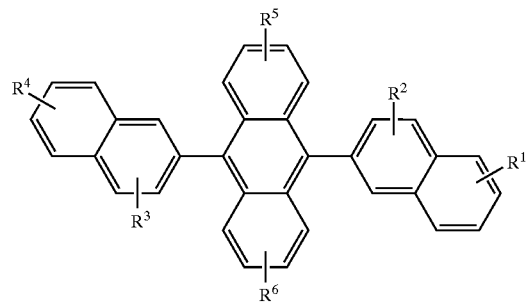

wherein $R_1$–$R_6$ represent one or more substituents on each ring and wherein each substituent is individually selected from the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Illustrative examples of derivatives of 9,10-di-(2-naphthyl)anthracene that are useful as hosts in the blue light-emitting layer include 9,10-di-(2-naphthyl)anthracene (ADN) itself and 2-1-butyl-9,10-di-(2-naphthyl)anthracene (TBADN), whose structures are shown below:

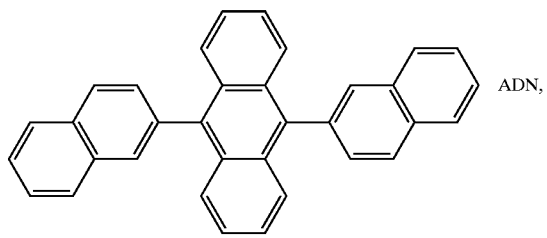

Formula II

ADN,

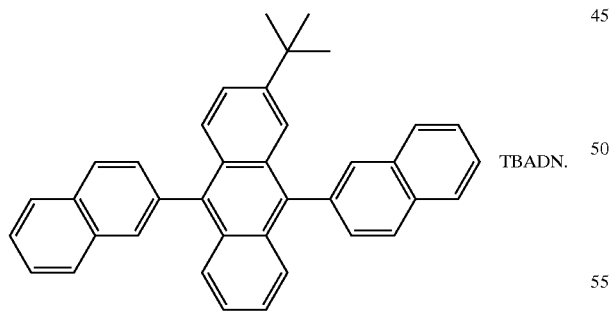

Formula III

TBADN.

Styrylarylene derivatives as described in U.S. Pat. No. 5,121,029 and JP 08333569 are also useful hosts for blue emission. For example, 9,10-bis[4-(2,2-diphenylethenyl) phenyl]anthracene and 4,4'-bis(2,2-diphenylethenyl)-1,1'-biphenyl (DPVBi) are useful hosts for blue emission.

Additional derivatives of anthracene having hydrocarbon or substituted-hydrocarbon substituents at the 9 and 10 positions and suitable as host materials for use with blue dopants include bianthryl and trianthryl compounds, as described in U.S. Pat. No. 6,534,199. In these anthracene derivatives, the substituent at the 9 or the substituents at both the 9 and 10 positions include(s) anthracene or a substituted anthracene. Any of the anthracene moieties in these bianthryl or trianthryl compounds can, if desired, bear one or more hydrocarbon, halogen, or cyano substituent(s).

Many blue dopants are known in the art and are contemplated for use in the practice of the present invention. A particularly useful class of blue dopants includes perylene and its derivatives such a perylene nucleus bearing one or more substituents such as alkyl, substituted alkyl, aryl, or halogen. A particularly preferred perylene derivative for use as a blue dopant is 2,5,8,11-tetra-t-butylperylene (TBP). Another particularly useful class of blue dopants includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-benzenes of the general structure shown below:

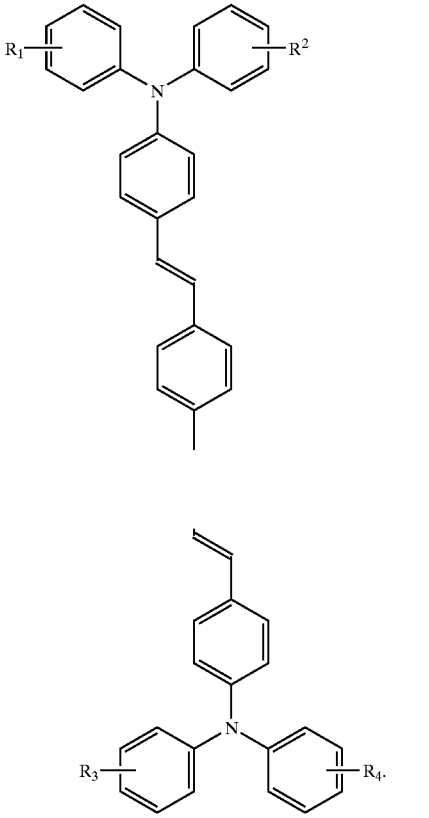

Formula IV and bis[2-[4-[N,N-diarylamino]phenyl]vinyl]biphenyls of the general structure shown below:

Formula V

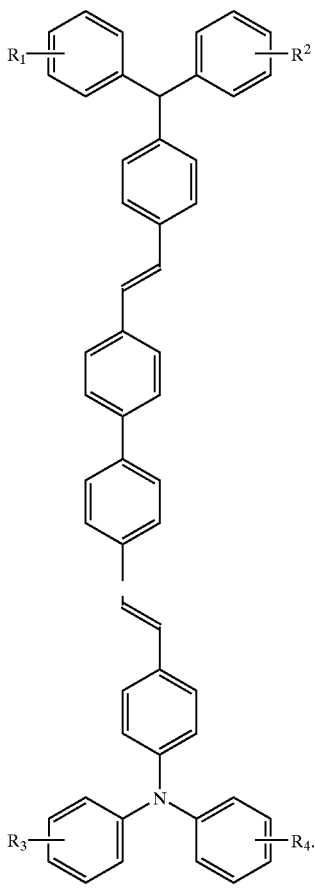

In Formulas IV and V, $R_1$–$R_4$ can be the same or different, and individually represent one or more substituents such as alkyl, aryl, fused aryl, halo, or cyano. In a preferred embodiment, $R_1$–$R_4$ are individually alkyl groups, each containing from one to about ten carbon atoms. A particularly preferred blue dopant of this class is 1,4-bis[2-[4-[N,N-di(p tolyl)amino]phenyl]vinyl]benzene (BDTAPVB)

Formula VI

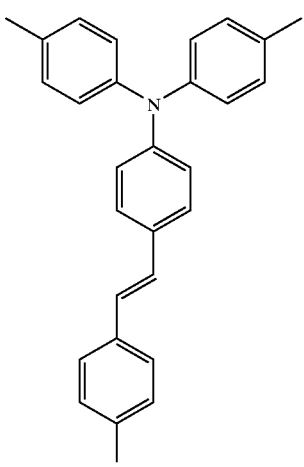

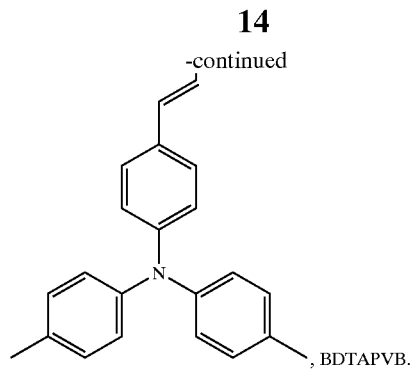, BDTAPVB.

Another useful class of blue dopants is represented by Formula VII and is described in commonly assigned U.S. patent application Ser. No. 10/183,242 filed Jun. 27, 2002 by Benjamin P. Hoag et al., entitled "Organic Element for Electroluminescent Devices", the disclosure of which is incorporated herein.

Formula VII

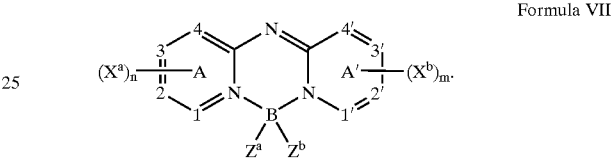

In Formula VII:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

In a preferred embodiment, $R_1$–$R_4$ are individually alkyl groups, each containing from one to about ten carbon atoms. A particularly preferred blue dopant of this class is 1,4-bis [2-[4-[N,N-di(p-tolyl)amino]phenyl]vinyl]benzene (BDTAPVB)

Formula VI

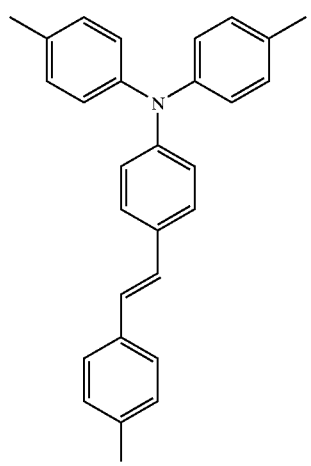

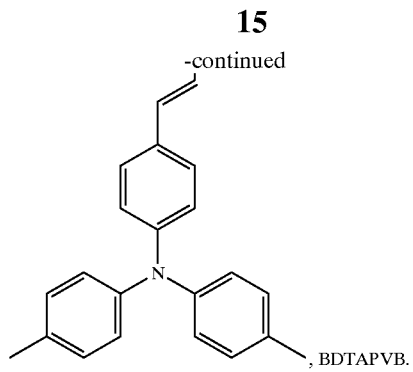

, BDTAPVB.

Another useful class of blue dopants is represented by Formula VII and is described in commonly assigned U.S. patent application Ser. No. 10/183,242 filed Jun. 27, 2002 now U.S. Pat. No. 6,661,023 by Benjamin P. Hoag et al., entitled "Organic Element for Electroluminescent Devices", the disclosure of which is incorporated herein.

Formula VII

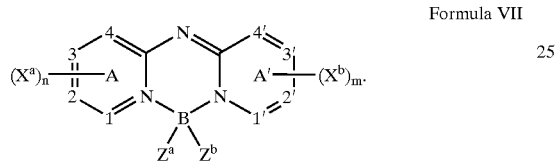

In Formula VII:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents; and 1, 2, 3, 4, 1', 2', 3', and 4' are independently selected as either carbon or nitrogen atoms.

Substituents $X^a$, $X^b$, $Z^a$, and $Z^b$ suitable for use in a dopant according to Formula VII are discussed in the above cited commonly assigned U.S. patent application Ser. No. 10/183,242. Desirably, to provide blue luminescence, the azine rings are either quinolinyl or isoquinolinyl rings such that 1, 2, 3, 4, 1', 2', 3', and 4' are all carbon; m and n are both equal to or greater than 2; and $(X^a)_n$ and $(X^b)_m$ each represent at least two substituents that join to form an aromatic ring. Desirably, to provide blue luminescence, $Z^a$ and $Z^b$ are fluorine atoms.

Preferred blue dopants further include materials where the two fused ring systems are quinoline or isoquinoline systems, i.e., there are present at least two $X^a$ groups and two $X^b$ groups that join to form 6—6 fused rings, the fused ring systems are fused at the 1-2,3-4,1'-2', or 3'-4' positions, respectively; one or both of the fused rings is substituted by an aryl or heteroaryl group; and where the dopant is depicted in Formula VIII, IX, or X. Blue dopants of this preferred structure include the following:

Formula VIII

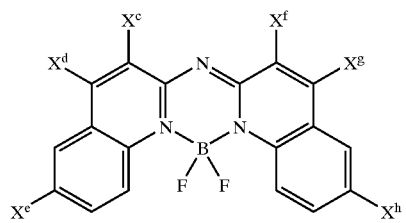

Formula IX

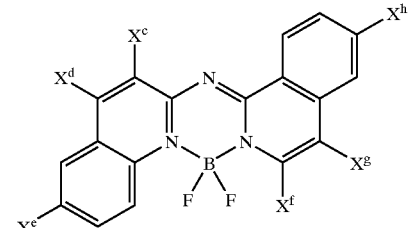

Formula X

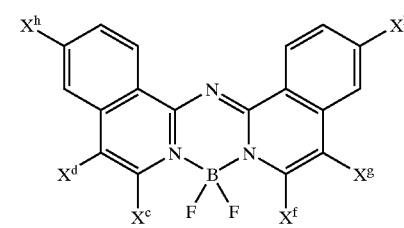

wherein each $X^c$, $X^d$, $X^e$, $X^f$, $X^g$, and $X^h$ is hydrogen or an independently selected substituent, one of which must be an aryl or heteroaryl group. These compounds can be described as boron compounds complexed by two ring nitrogens of a deprotonated bis(azinyl)amine ligand, wherein the two ring nitrogens are members of different 6—6 fused ring systems in which at least one of the systems contains an aryl or heteroaryl substituent.

Illustrative, non-limiting examples of compounds according to Formulas VIII–X that provide blue luminescence and are useful as blue dopants in the blue light-emitting layer are the following:

Formula XI

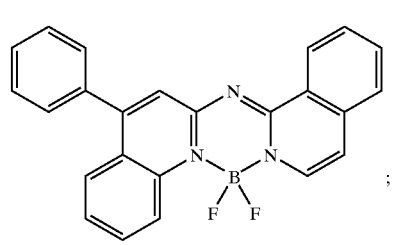

Formula XII

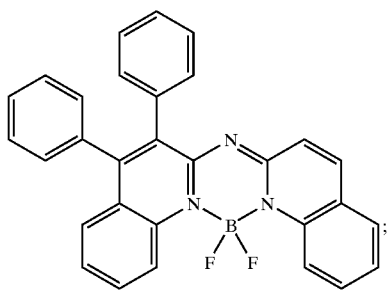

Formula XIII

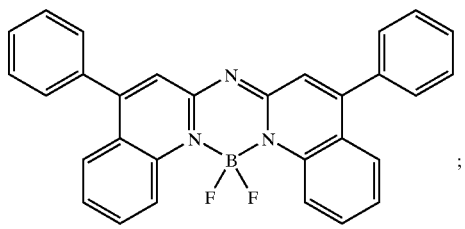

Formula XIV

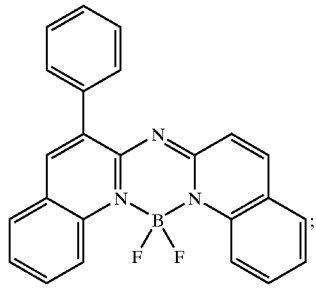

Formula XV

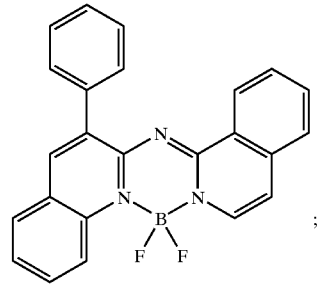

Formula XVI

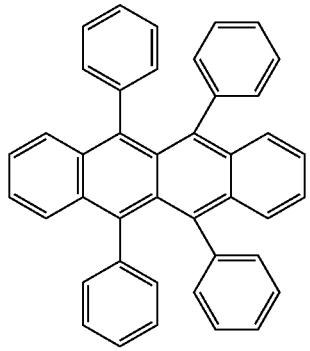

or

Formula XVII

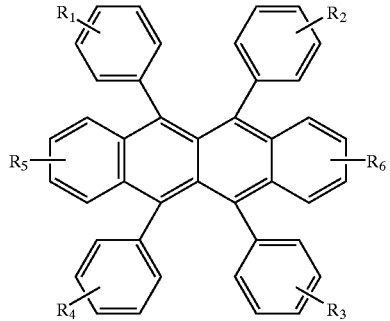

The blue dopant can also be a mixture of compounds that would also be blue dopants individually. The blue light-emitting layer can contain one or more additional dopants whose principal function is to increase the luminous yield of the device. A class of compounds that increases the luminous yield includes triarylamines. Preferred additional triarylamine dopants for this function include NPB and TNB.

Preferred materials for use as yellow dopants in the hole-transporting layer, the electron-transporting layer, or both the hole-transporting layer and the electron-transporting layer are those represented by Formula XVIII.

Formula XVIII wherein $R_1$–$R_6$ represent one or more substituents on each ring and where each substituent is individually selected from one of the categories described above. Preferred as $R_1$–$R_4$ are substituents selected from Categories 3 and 4 above.

Examples of particularly useful yellow dopants include 5,6,11,12-tetraphenylnaphthacene (rubrene); 6,11-diphenyl-5,12-bis(4-(6-methyl-benzothiazol-2-yl)phenyl) naphthacene (DBzR) and 5,6,11,12-tetra(2-naphthyl) naphthacene (NR), the formulas of which are shown below:

(Formula XIX)

Rubrene,;

-continued

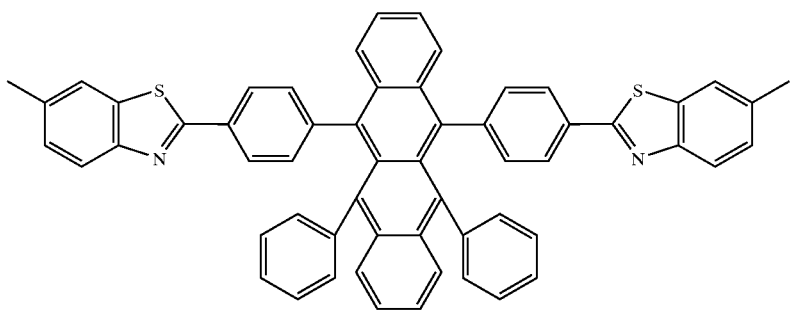

DBzR; and

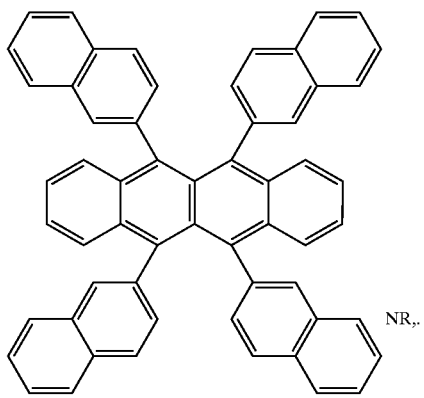

NR;.

The yellow dopant can also be a mixture of compounds that would also be yellow dopants individually.

Red dopants useful in the present invention include diindenoperylene compounds as described in U.S. patent application Ser. No. 10/334,324 filed Dec. 31, 2002. The diindenoperylene compounds can be represented by Formula XXII:

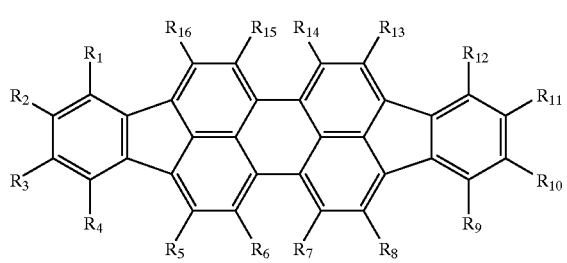

Formula XXII wherein:

$R_1$–$R_{16}$ are independently selected as hydro or other substituents that provide red luminescence; see, for example, the above cited U.S. patent application Ser. No. 10/334,324;

provided that any of the indicated substituents can join to form further fused rings.

In one desirable embodiment that provides red luminescence, $R_1$–$R_{16}$ are selected independently from the category including hydro, alkyl and aryl. Particularly useful diindenoperylene dopants that provide red luminescence are those in which $R_1$–$R_{16}$ are independently selected from the category including hydro and aryl, including aryl rings fused to the diindenoperylene skeleton, as illustrated by the formulas shown below:

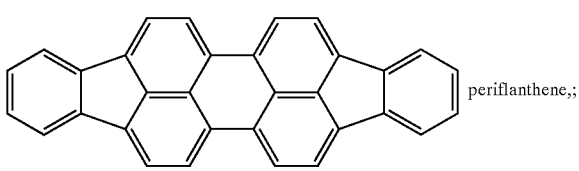

Formula XXIII periflanthene;

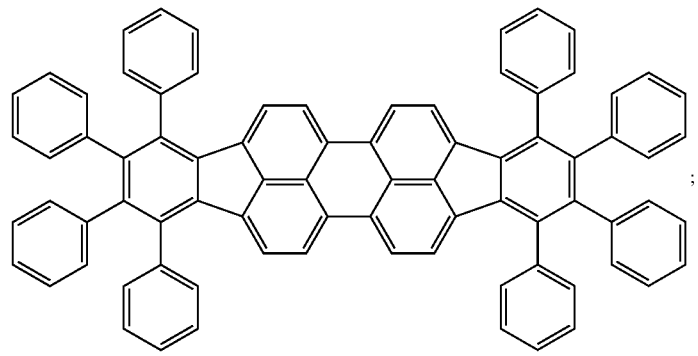
Formula XXIV
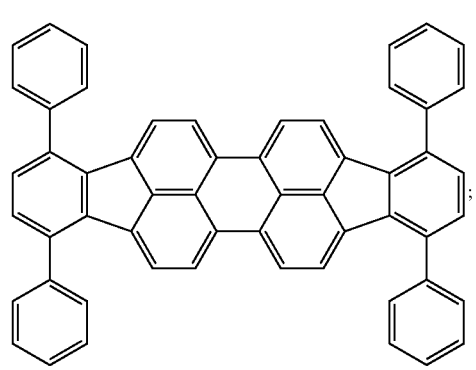
Formula XXV
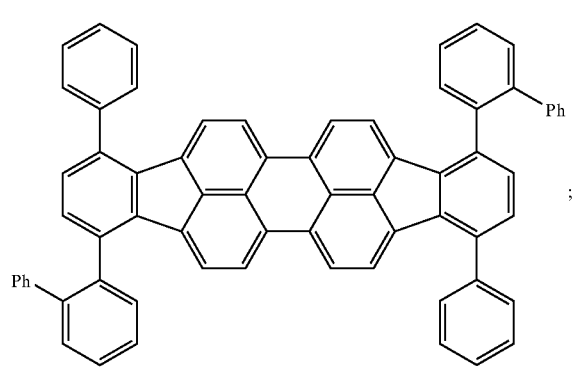
Formula XXVI
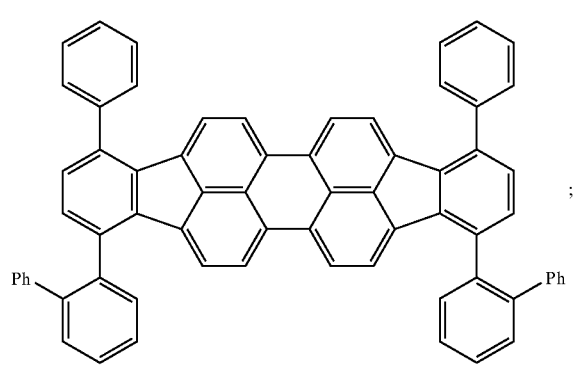
Formula XXVII

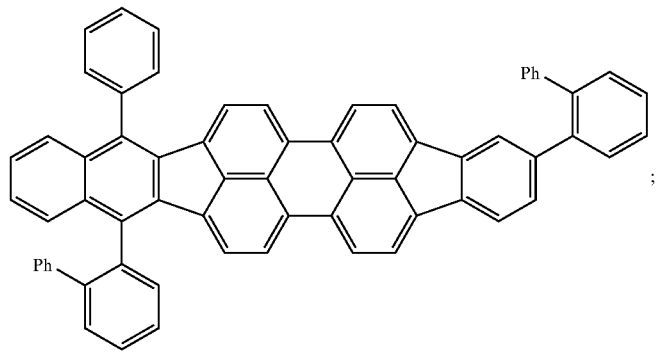
Formula XXVIII
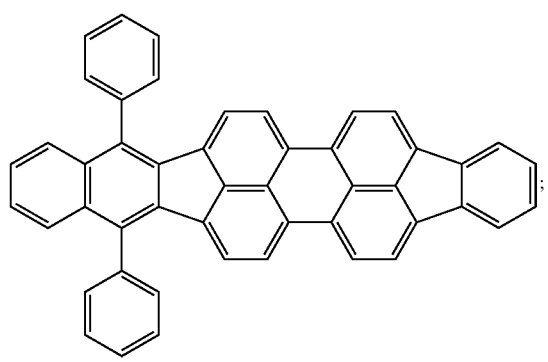
Formula XXIX
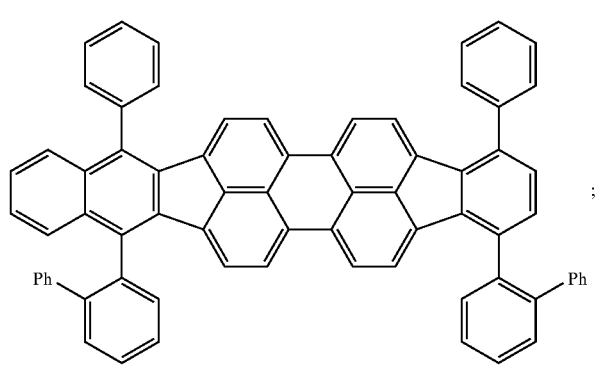
Formula XXX
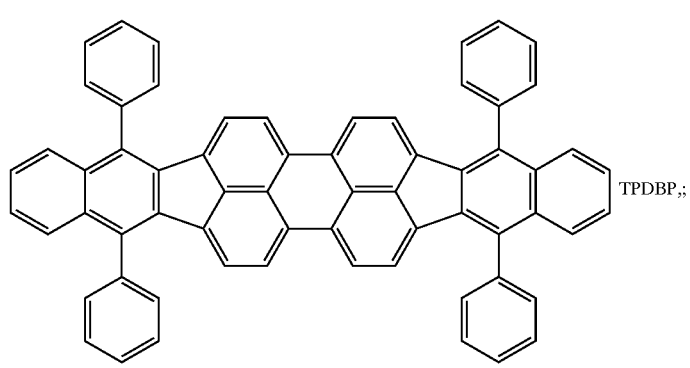
Formula XXXI
TPDBP,;

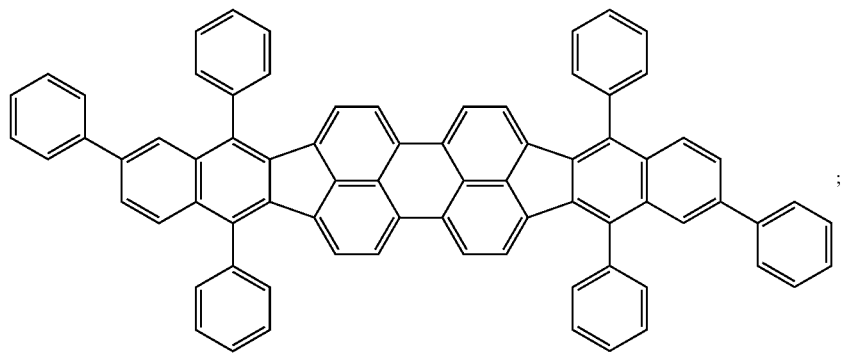
Formula XXXII
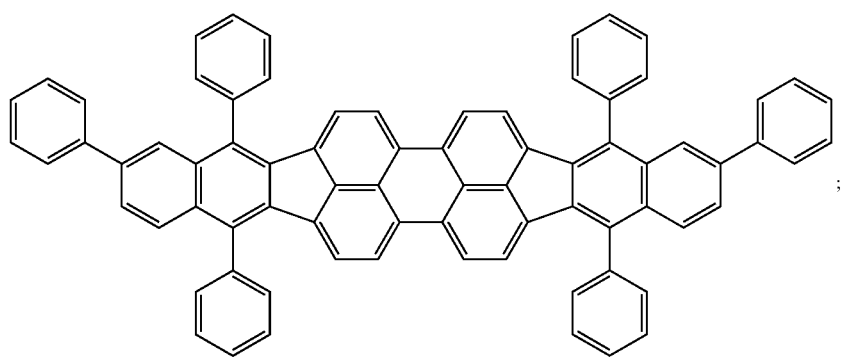
Formula XXXIII
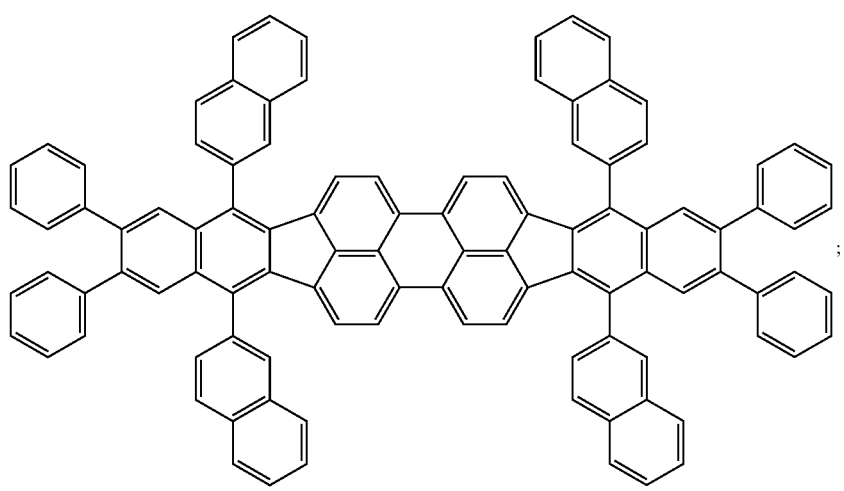
Formula XXXIV

Formula XXXV
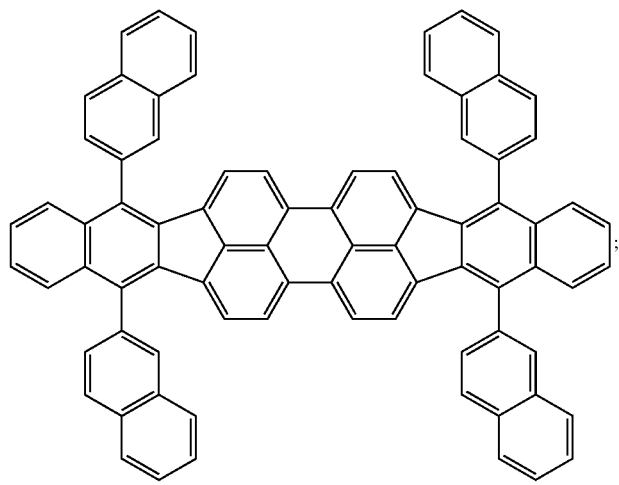
Formula XXXVI
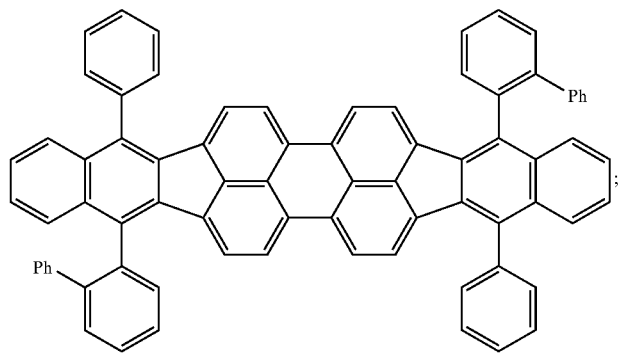
Formula XXXVII
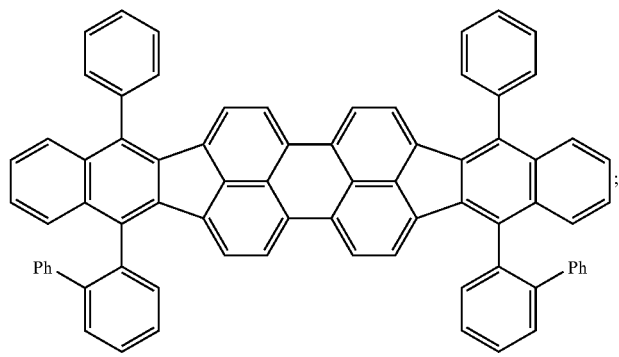
Formula XXXVIII
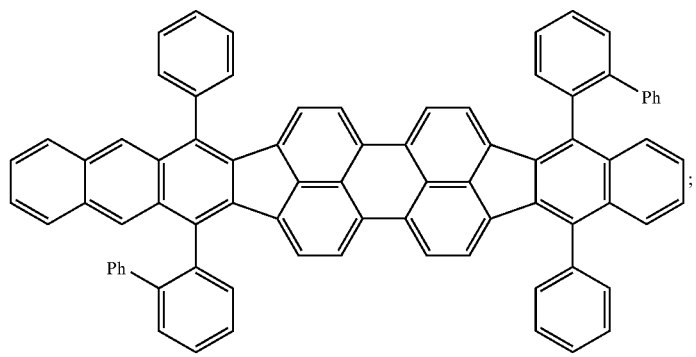

-continued
Formula XXXIX
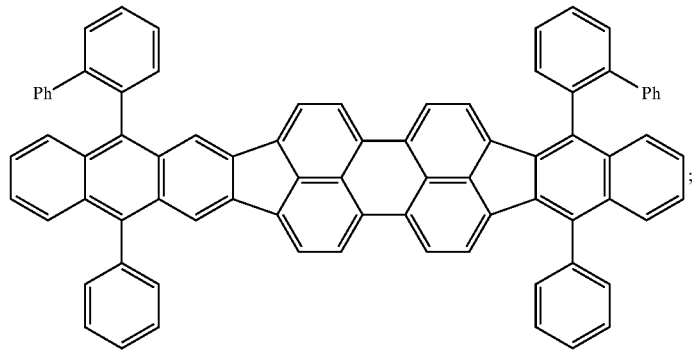
Formula XL
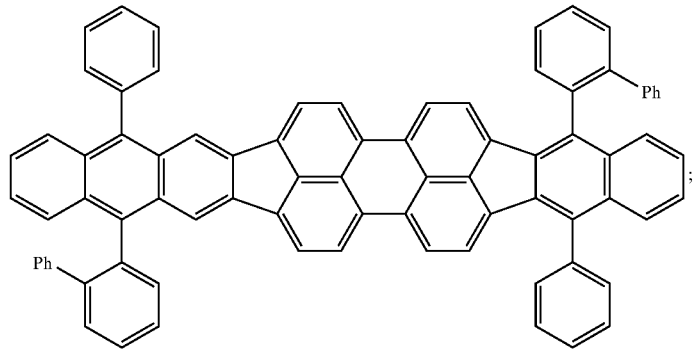
Formula XLI
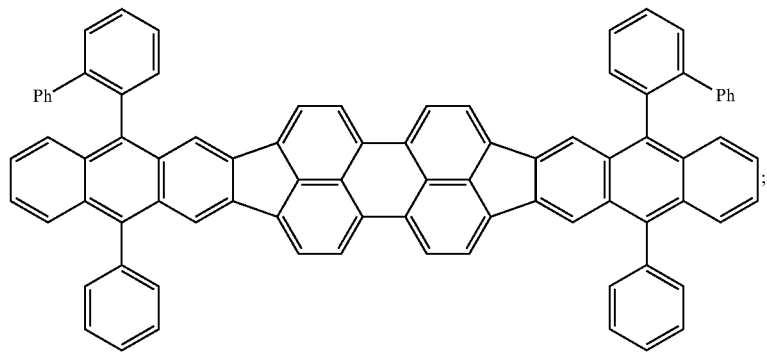
Formula XLII
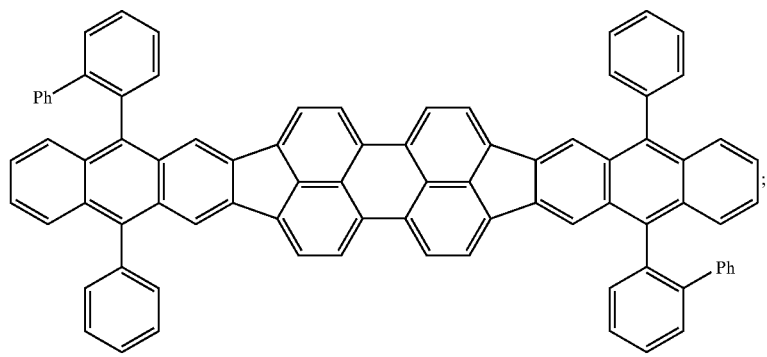
Formula XLIII
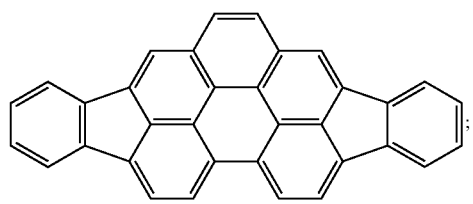

Formula XLIV

Formula XLV

Formula XLVI

Formula XLVII

; or

Formula XLVIII

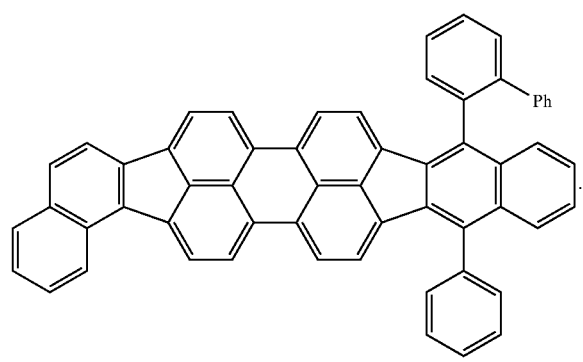

A particularly preferred diindenoperylene dopant is dibenzo{[[ff']-4,4'7,7'-tetraphenyl]diindeno-[1,2,3-cd:1',2',3'-lm]perylene (TPDBP).

Other red dopants useful in the present invention belong to the DCM class of dyes represented by Formula (XLIX):

Formula XLIX

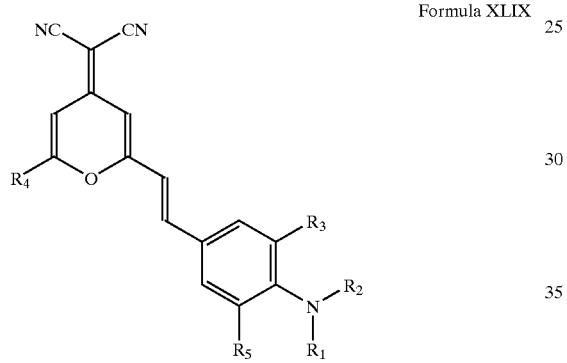

wherein $R_1$–$R_5$ represent one or more groups independently selected from: hydro, alkyl, substituted alkyl, aryl, or substituted aryl; $R_1$–$R_5$ independently include acyclic groups or are joined pairwise to form one or more fused rings; provided that $R_3$ and $R_5$ do not together form a fused ring.

In a useful and convenient embodiment that provides red luminescence, $R_1$–$R_5$ are selected independently from: hydro, alkyl and aryl. Structures of particularly useful dopants of the DCM class are shown below:

Formula L

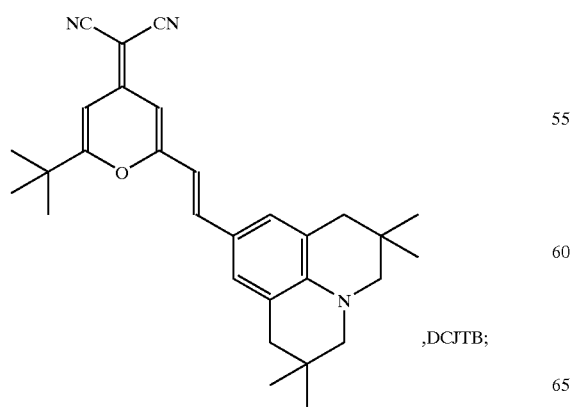

,DCJTB;

Formula LI

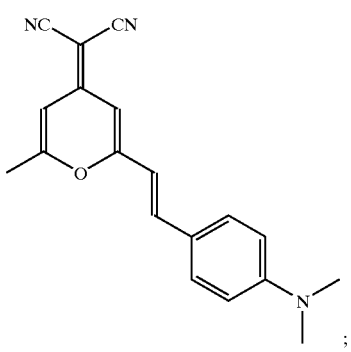

;

Formula LII

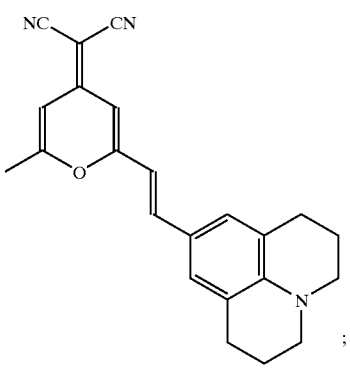

;

Formula LIII

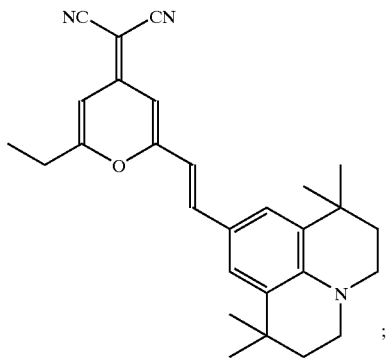

;

Formula LIV

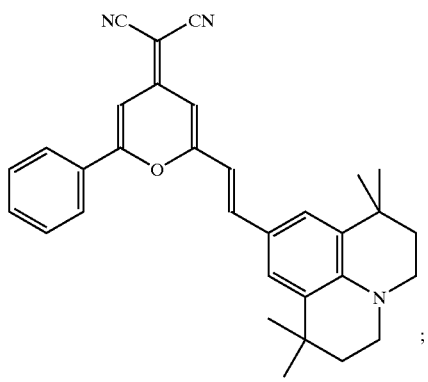

Formula LV

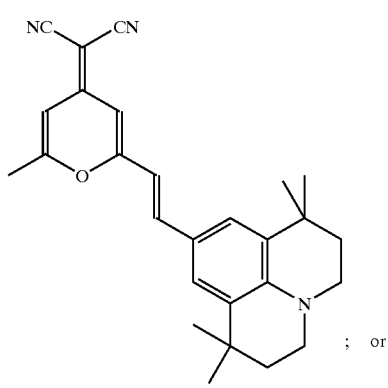
; or

Formula LVI

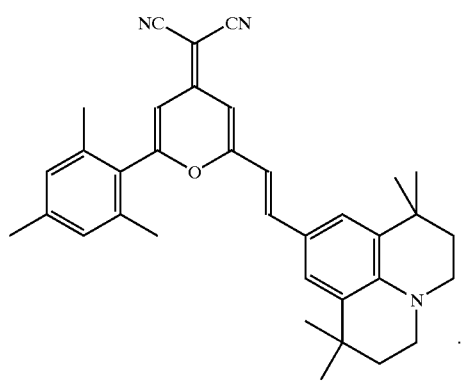

A preferred DCM dopant is DCJTB. The red dopant can also be a mixture of compounds that would also be red dopants individually.

Coumarins are a class of useful green dopants, as described by Tang et al. in U.S. Pat. Nos. 4,769,292 and 6,020,078. An example of a useful green coumarin is C545T, whose structural formula is shown below:

(Formula LVII)

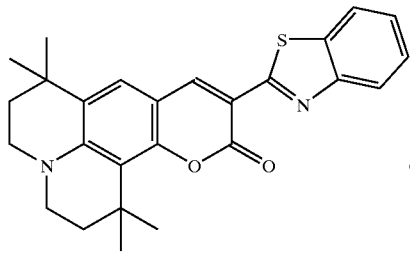
C545T,.

Quinacridones represent another class of useful green dopants. Useful quinacridones are described in U.S. Pat. No. 5,593,788, publication JP 09-13026A, and commonly assigned U.S. patent application Ser. No. 10/184,356 filed Jun. 27, 2002, now abandoned by Lelia Cosimbescu, entitled "Device Containing Green Organic Light-Emitting Diode", the disclosure of which is incorporated herein.

Examples of particularly useful green quinacridones are shown below:

(Formula LVIII)

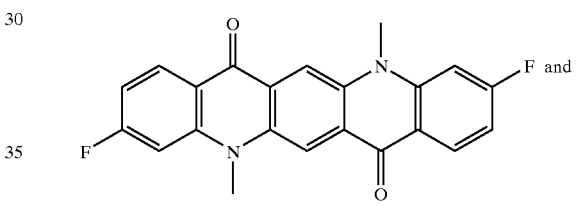
F and (Formula LIX)

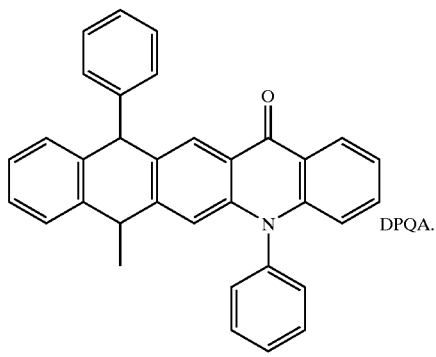
DPQA.

Another useful class of green dopants is represented by Formula LX below.

(Formula LX)

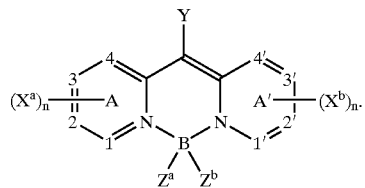

wherein:

A and A' represent independent azine ring systems corresponding to 6-membered aromatic ring systems, each containing at least one nitrogen;

each $X^a$ and $X^b$ is an independently selected substituent, two of which can join to form a fused ring to A or A';

m and n are independently 0 to 4;

Y is H or a substituent;

$Z^a$ and $Z^b$ are independently selected substituents; and atoms 1–4 and 1'-4' are independently selected as either carbon or nitrogen atoms.

Substituents $X^a$, $X^b$, Y, $Z^a$, and $Z^b$ suitable for use in a dopant according to Formula LX are discussed in the above cited commonly assigned U.S. patent application Ser. No. 10/183,242 now U.S. Pat. No. 6,661,023. Desirably, to provide green luminescence, the azine rings are either quinolinyl or isoquinolinyl rings such that 1, 2, 3, 4, 1', 2', 3', and 4' are all carbon; m and n are equal to or greater than 2; and $(X^a)_m$ and $(X^b)_n$ each represent at least two substituents that join to form an aromatic ring. Desirably, to provide green luminescence, $Z^a$ and $Z^b$ are fluorine atoms.

In some convenient embodiments, 1–4 and 1'-4' are all carbon atoms. Desirably, either substituent $X^a$ forms a ring that is fused to ring A, or substituent $X^b$ forms a ring that is fused to ring A', or both substituents $X^a$ and $X^b$ form rings that are fused to rings A and A', respectively. In one useful embodiment, there is present at least one $X^a$ or $X^b$ substituent selected from the category including halo, alkyl, aryl, alkoxy, and aryloxy substituents. In another embodiment, there is present a $Z^a$ and $Z^b$ substituent independently selected from the category including fluoro and alkyl, aryl, alkoxy and aryloxy substituents. In one desirable embodiment, $Z^a$ and $Z^b$ are both fluoro substituents. Y is suitably hydrogen or a substituent such as cyano, carboxyl, alkyl, trifluoromethyl, aryl, aryl, or heterocyclic. Formulas for some examples of useful green dopants of the general structure shown in Formula LX are shown below:

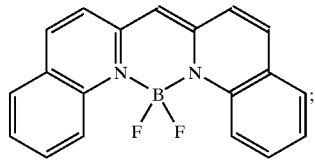

Formula LXI

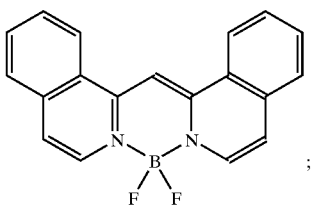

Formula LXII

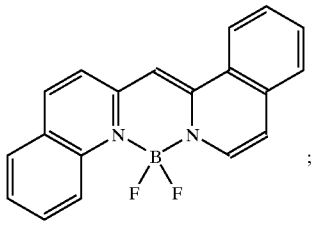

Formula LXIII

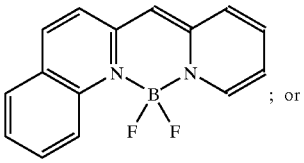

Formula LXIV

; or

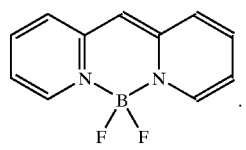

Formula LXV

Hereinafter, the percentage of a dopant in a layer indicates the percentage by volume of the dopant relative to the total material in the layer, as measured using thin-film deposition monitors. The blue dopant comprises 0.1 to 10%, and preferably 0.75 to 2%, of the blue light-emitting layer. Additional dopants, such as triarylamine compounds, comprise from 0 to 30% and preferably from 0 to 15% of the blue light-emitting layer. The yellow dopant comprises 0.5 to 50% of the hole-transporting layer or sublayer in which it is codoped with the red dopant, and preferably 2 to 30%. The red dopant comprises about 0.1 to 5%, and preferably 0.5 to 1%, of the hole-transporting layer or sublayer in which it is codoped with the yellow dopant. When a green dopant is present in an electron-transporting layer or sublayer, it comprises 0.1 to 3%, and preferably 0.25 to 1%, of that layer or sublayer. When a red dopant is present in an electron-transporting layer or sublayer, the red dopant comprises 0.1 to 3%, and preferably 0.25 to 1%, of that layer or sublayer.

The thickness of the hole-transporting layer is between 20 and about 250 nm, and preferably between 70 and 150 nm. The thickness of the blue light-emitting layer is between 10 and 50 nm, and preferably between 20 and 40 nm. The thickness of the electron-transporting layer is between 10 and 100 nm, and preferably between 20 and 40 nm. When only a sublayer of the hole-transporting layer is codoped with a yellow and a red dopant, the thickness of that sublayer is between 5 and 50 mm, and preferably between 10 and 30 nm. When a light-emitting dopant is present in an electron-transporting sublayer, the thickness of that sublayer is between 5 and 40 nm, and preferably between 10 and 20 nm. When an additional layer is present between the light-emitting layer and the hole-transporting layer or the electron-transporting layer, the thickness of that layer is between 1 and 10 nm and preferably between 2 and 5 mm. The thickness of the cathode is usually between 20 and 400 run, and preferably between 50 and 250 nm.

The OLEDs of the present invention can be used in any application that requires a source of white light. They can be used as compact light sources such as paper-thin light sources, and in area lighting such as office lighting and automotive dome lights. They can be used in display devices either as individually addressable light sources or as backlights in LCDs. In multicolor display devices, the OLEDs constructed according to the present invention can be used with red, green, and blue color filters. Such filters are well known in the art, as are means of using them in the construction of full-color or multicolor display devices. Representative of red, green, and blue filters are the commercially available R37, G37, and B37 filters. The spectral band passed by the R37 filter comprises all visible wavelengths exceeding about 585 run. The spectral band passed by the G37 filter includes all visible wavelengths between about 480 and about 585 nm. The spectral band passed by the B37 filter includes all visible wavelengths shorter than about 525 run.

EXAMPLES

The present invention and its advantages are illustrated by the examples that follow. The procedure for fabrication of all of the OLEDs described hereinafter is illustrated for the case of Comparative Example 1. The current-voltage characteristics of each OLED were evaluated using a constant-current source-meter unit. The electroluminescence spectrum and yield were evaluated, without the use of filters, using the constant-current source and a diode-array spectrometer. The emission was also filtered through a commercially available R37 red, G37 green, or B37 blue filter and the photometric performance for each transmitted color was also measured.

For some of the Examples, the power consumption of a simulated full-color 2.2-inch-diagonal square OLED display panel was calculated for luminance of 100 cd/m$^2$ at the D60 or D65 white point. The D60 and D65 white points correspond to CIE coordinates of (0.32,0.33) and (0.31,0.33), respectively. The simulated device included the white OLED of the Example, colored pixels with individual R37, G37, and B37 filters, and a polarizer with a transmittance of 0.4. It was further assumed that each pixel requires a drive voltage of 13 V. This value exceeds the drive voltage for the OLEDs themselves in order to simulate inefficiencies in the drive circuitry. The desired display luminance and CIE coordinates were combined with the luminous yield and CIE coordinates of the OLED as measured through the color filters, to estimate the current required to drive the red, green, and blue pixels of the simulated display. It was assumed that the luminance for each pixel is proportional to the drive current, and the proportionality constant was evaluated from the luminance at 20 mA/cm$^2$. The method of such simulations is obvious to one skilled in the art.

The operational stability (device lifetime) was evaluated by operating an OLED at a constant average current density of 20 mA/cm$^2$ and at 70° C. while monitoring its luminance and drive voltage. The average 20 mA/cm$^2$ current density was supplied as 0.5 ms periods of 40 mA/cm$^2$ current density alternating with 0.5 ms periods of 14 V reverse bias.

Comparative Example 1

The OLED of Comparative Example 1 had the same structure as the inventive device shown in FIG. 3, except that the hole-transporting layer (340) contained only a yellow dopant. An 80 nm layer of ITO on a glass substrate (210) was patterned to define the anodes (320) of several OLEDs on the same substrate. The anodes were sequentially ultrasonicated in a commercial detergent, rinsed in deionized water, and degreased in toluene vapor. The ITO layer was treated with an oxygen plasma for about one minute, and then coated with 1 nm of a fluorocarbon layer, the hole-injection layer (330), by plasma assisted deposition of CHF$_3$. The resulting coated substrate was transferred to a vacuum chamber, where the following additional layers were fabricated sequentially over the hole-injection layer by vacuum vapor deposition: 150 nm of NPB containing 2% of rubrene as the hole-transporting layer (HTL, 340), 20 nm of TBADN doped with 2% TBP as the blue light-emitting layer (350), 35 nm of Alq as the electron-transporting layer (ETL, 360), and finally 220 nm of Mg containing 10% Ag, patterned so as to supply the cathodes (370) for the several OLEDs. The above sequence completed the deposition of the OLEDs. The OLEDs were then hermetically packaged in a glove box filled with dry nitrogen for protection against the ambient environment.

Examples 2–4

The OLEDs of Examples 2–4 were constructed similarly to that of Comparative Example 1, except that the HTL was codoped with 2% of rubrene and with DCJTB as a red dopant, the percentages being indicated in Table 1a. Also reported in Table Ia is the performance of the devices at a current density of 20 mA/cm$^2$ in terms of drive voltage and photometric parameters (luminous yield and CIE coordinates) with no color filter. The same photometric parameters are reported in Table Ib for each OLED with a red, green, or blue color filter.

TABLE Ia

Composition and performance parameters of the OLEDs of Examples 1–4 without color filters and at a current density of 20 mA/cm$^2$
Column 2 indicates the percentage of the red dopant, DCJTB, in the hole-transporting layer; Column 3 reports the drive voltage; Column 4 reports the luminous yield; and Column 5 reports the CIE coordinates

| Example | % DCJTB | $V_{drive}$ (V) | Yield (cd/A) | CIEx, CIEy |
|---|---|---|---|---|
| 1 | 0 | 6.7 | 4.0 | 0.34, 0.41 |
| 2 | 0.1 | 6.8 | 4.3 | 0.37, 0.44 |
| 3 | 0.25 | 6.9 | 4.5 | 0.39, 0.46 |
| 4 | 0.5 | 6.8 | 4.6 | 0.41, 0.47 |

TABLE Ib

Photometric properties of the OLEDs of Examples 1–4 measured through R37 red, G37 green, and B37 blue filters

| | Red | | Green | | Blue | |
|---|---|---|---|---|---|---|
| Example | Yield (cd/A) | CIEx, CIEy | Yield (cd/A) | CIEx, CIEy | Yield (cd/A) | CIEx, CIEy |
| 1 | 0.9 | 0.60, 0.36 | 2.7 | 0.34, 0.56 | 0.6 | 0.13, 0.20 |
| 2 | 1.0 | 0.60, 0.37 | 2.9 | 0.35, 0.56 | 0.6 | 0.13, 0.23 |
| 3 | 1.0 | 0.61, 0.37 | 3.0 | 0.37, 0.57 | 0.5 | 0.14, 0.26 |
| 4 | 1.1 | 0.61, 0.37 | 3.0 | 0.37, 0.57 | 0.5 | 0.14, 0.29 |

The OLEDs of Examples 2 to 4, relative to the OLEDs of Comparative Example 1, demonstrated an increase in luminous yield with no filter and with a red or green filter, and a modest decrease in the luminous yield with a blue filter. The CIE coordinates with the red filter changed very little, and the CIE coordinates with the green and blue filters changed somewhat. There was negligible change in the drive voltage. The increased luminous yield with a red filter is an advantage of the use of a codoped hole-transporting layer according to the present invention.

Examples 5–9

The OLEDs of Examples 6 to 9 were prepared following the structure of OLED 400 as shown in FIG. 4. The hole-transporting layer included a 130 nm thick sublayer of undoped NPB (441) and a 20 nm thick sublayer (442) of NPB codoped with 2% of rubrene as a yellow dopant and various percentages of DCJTB as a red dopant. The blue light-emitting layer (450) was a 25 nm thick layer of TBADN as host doped with 5% BDTAPVB as a blue dopant. The electron-transporting layer (460) was 35 nm of Alq. The OLED of Comparative Example 5 was similar, except that sublayer 442 contained no DCJTB. With respect to the substrate (410), anode (420), hole-injection layer (430), and cathode (470), the OLEDs of Examples 5–9 were the same as for the OLED of Comparative Example 1.

Tables IIa and IIb indicate the percentages of DCJTB and the performance of these devices at 20 mA/cm$^2$. Included is the power consumption of the simulated display panel operated at the D60 white point. The luminous yield without a filter was somewhat decreased by the presence of the DCJTB dopant. There was negligible change in the drive voltage. The luminous yield with the green and blue filters also decreased, and the CIE coordinates changed somewhat. However, and most importantly, the luminous yield with the red filter increased significantly, and the color with the red filter shifted towards a more saturated red. Moreover, the predicted power consumption at D60 white point decreased significantly. The increased efficiency with a red filter, the improved red color, and the decreased power consumption at the D60 white point are advantages of the use of a codoped hole-transporting sublayer according to the present invention.

Because of the improved luminous yield of the red light produced by the white OLEDs constructed according to the present invention with a suitable color filter, the simulated full-color display panel using the white OLEDs constructed according to the present invention with suitable color filters has an improved efficiency of the red component. Therefore, the simulated full-color display using white OLEDs constructed according to the present invention with suitable color filters has a reduced power requirement for the red pixels. In addition, the simulated full-color display using the white OLEDs constructed according to the present invention with suitable color filters has an improved color purity of the red component.

TABLE IIa

Composition and performance parameters of the OLEDs of Examples 5–9
Columns have the same significance as in Table Ia

| Example | % DCJTB | $V_{drive}$ (V) | Yield (cd/A) | CIEx, CIEy |
|---|---|---|---|---|
| 5 | 0 | 6.8 | 10.0 | 0.25, 0.37 |
| 6 | 0.25 | 6.9 | 9.9 | 0.29, 0.38 |
| 7 | 0.50 | 6.8 | 9.5 | 0.31, 0.38 |
| 8 | 0.75 | 6.7 | 8.9 | 0.32, 0.37 |
| 9 | 1.0 | 6.7 | 8.3 | 0.33, 0.37 |

Figure 7:
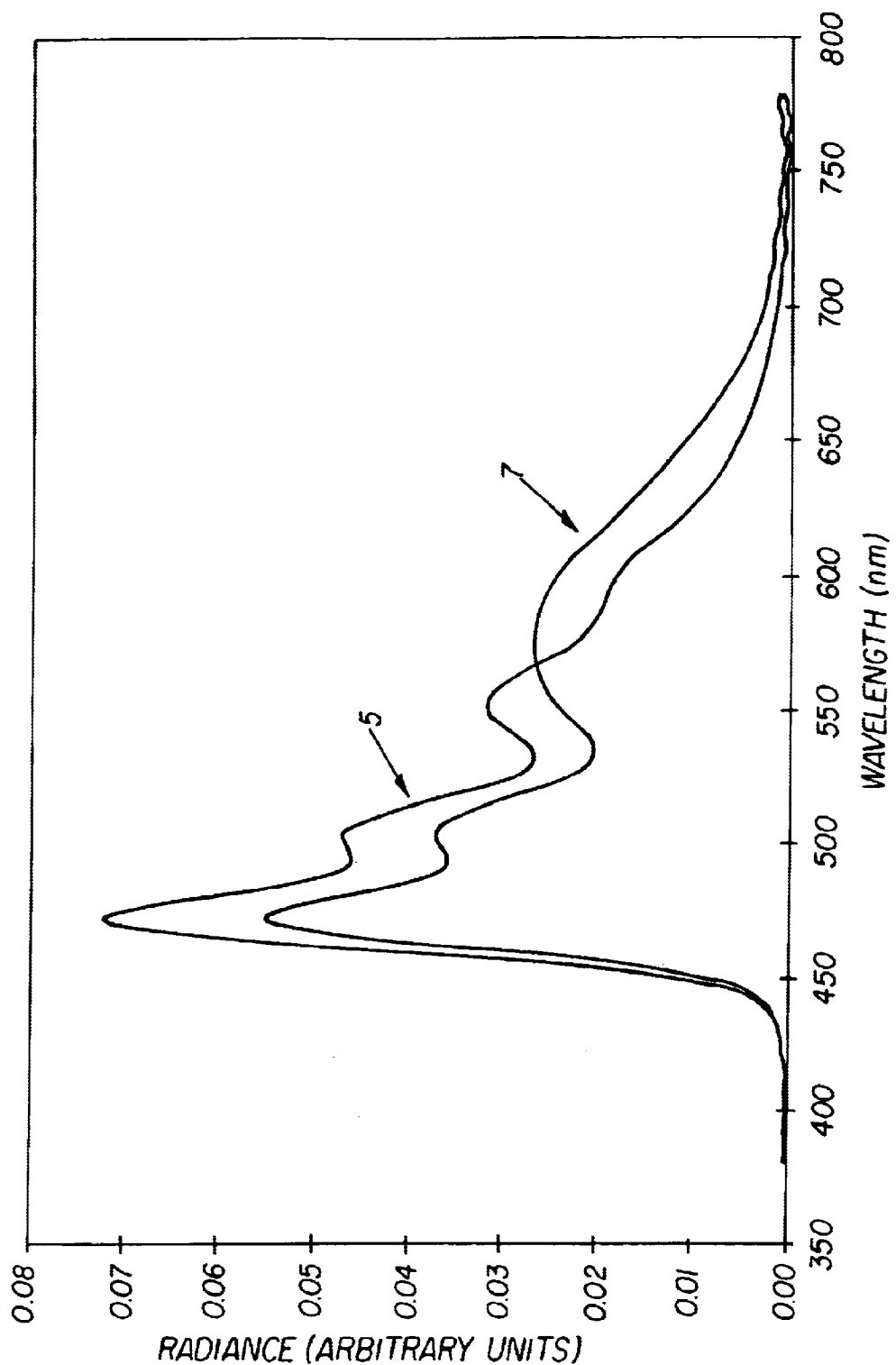
FIGS. 7 and 8 depict electroluminescence (EL) spectra of white OLEDs, including white OLEDs constructed according to the present invention.

The EL spectra of the devices of Examples 5 and 7, also at 20 mA/cm$^2$, are shown in FIG. 7. In that Figure, the arrows and numerals indicate the spectra associated with the respective Examples. With the addition of the red dopant DCJTB in the HTL, the intensity in the red portion of the spectrum increased, while the intensity in the blue portion of the spectrum decreased. These changes in the unfiltered emission spectrum of the OLED are believed to be responsible for the changes in relative intensities measured through blue and red filters and for the increasing saturation of the emission through the red filter. The explanation of the modest decrease in efficiency with the green filter is more complicated, since the unfiltered emission for Example 7 relative to that for Comparative Example 5 is more intense in one part of the green region of the spectrum and less intense in another part.

Examples 10–13

The OLEDs of Comparative Example 10 and Examples 11 to 13 had the structure shown in FIG. 3 and were prepared similarly to the devices of Examples 1 to 4 except that the red dopant was TPDBP instead of DCJTB.

Tables IIIa and IIIb indicate the percentages of TPDBP and the performance of these devices. The effects of the presence of TPDBP as a red dopant were similar to those of DCJTB in Examples 5–9, except that the drive voltage increased, by less than 1 volt, as the percentage of the red dopant increased. However, and most importantly, the luminous yield with the red filter increased by approximately a factor of 1.8 while the color approached a more saturated red. The improvements in efficiency and color of Examples 11–13 relative to Comparative Example 10 illustrate the advantage of using a codoped hole-transporting layer according to the present invention.

Figure 8:
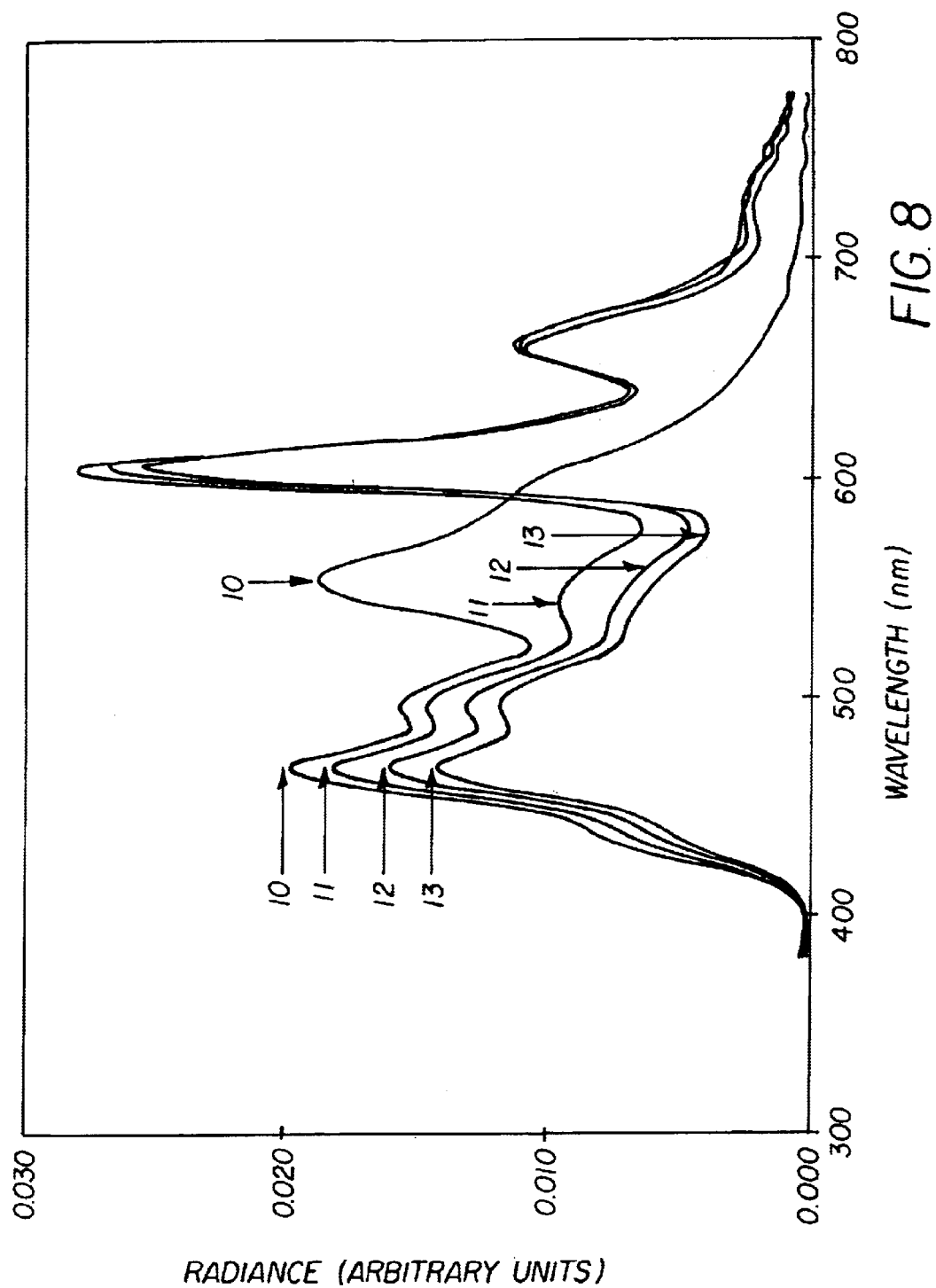

The EL spectra of the devices of Examples 10–13 are shown in FIG. 8. In that Figure, the arrows and numerals again indicate the spectra associated with the respective Examples. The greatest effect of the red dopant TPDBP is to replace the yellow emission of the yellow dopant rubrene, which peaks at approximately 560 nm, by the reddish emission of the red dopant TPDBP, which peaks at approximately 610 nm and has substantial intensity at yet longer wavelengths. A lesser effect is to reduce the intensity of the blue emission of TBP, which peaks at approximately 470 nm. The improved performance with a red filter is believed to be a consequence of the increased red component in the unfiltered spectrum.

TABLE IIb

Photometric properties of the OLEDs of Examples 5–9 measured through R37 red, G37 green, and B37 blue filters, and predicted power consumption of a 2.2-inch-diagonal square display panel using these OLEDs as the light source

| | Red | | Green | | Blue | | D60 White |
|---|---|---|---|---|---|---|---|
| Example | Yield (cd/A) | CIEx,CIEy | Yield (cd/A) | CIEx,CIEy | Yield (cd/A) | CIEx,CIEy | Power (W) |
| 5 | 1.6 | 0.57,0.36 | 6.8 | 0.25,0.54 | 2.6 | 0.11,0.22 | 2.01 |
| 6 | 2.0 | 0.59,0.36 | 6.5 | 0.28,0.54 | 2.3 | 0.11,0.23 | 1.82 |
| 7 | 2.2 | 0.61,0.36 | 5.9 | 0.29,0.53 | 2.0 | 0.11,0.22 | 1.80 |
| 8 | 2.2 | 0.61,0.35 | 5.6 | 0.29,0.53 | 2.0 | 0.11,0.22 | 1.83 |
| 9 | 2.2 | 0.61,0.35 | 5.2 | 0.29,0.52 | 1.8 | 0.11,0.22 | 1.94 |

TABLE IIIa

Composition and performance parameters of the OLEDs
of Examples 10–13
Columns have the same significance as in Table Ia,
except that the red dopant was TPDBP

| Example | % TPDBP | $V_{drive}$ (V) | Yield (cd/A) | CIEx, CIEy |
|---|---|---|---|---|
| 10 | 0 | 7.3 | 4.8 | 0.30, 0.37 |
| 11 | 0.25 | 7.7 | 4.1 | 0.36, 0.33 |
| 12 | 0.5 | 7.9 | 3.6 | 0.37, 0.32 |
| 13 | 0.75 | 8.1 | 3.3 | 0.38, 0.32 |

TABLE IIIb

Photometric properties of the OLEDs of Examples 10–13
measured through R37 red, G37 green, and B37 blue filter

| | Red | | Green | | Blue | |
|---|---|---|---|---|---|---|
| Example | Yield (cd/A) | CIEx, CIEy | Yield (cd/A) | CIEx, CIEy | Yield (cd/A) | CIEx, CIEy |
| 10 | 0.9 | 0.57, 0.35 | 3.3 | 0.30, 0.55 | 0.9 | 0.13, 0.18 |
| 11 | 1.6 | 0.62, 0.34 | 2.3 | 0.32, 0.51 | 0.8 | 0.13, 0.17 |
| 12 | 1.4 | 0.63, 0.33 | 1.9 | 0.32, 0.50 | 0.7 | 0.13, 0.17 |
| 13 | 1.3 | 0.63, 0.33 | 1.7 | 0.32, 0.50 | 0.6 | 0.13, 0.17 |

Examples 14–17

The OLEDs of Examples 15 to 17 had the structure shown in FIG. 4 and were prepared similarly to the devices of Examples 5 to 9. The hole-transporting layer included a 130 nm thick sublayer of undoped NPB (441) and a 20 nm thick sublayer (442) of NPB codoped with 3% of DBzR as a yellow dopant and various percentages of TPDBP as a red dopant. The blue light-emitting layer (450) was a 20 nm thick layer of TBADN as host doped with 2% BDTAPVB as a blue dopant. The electron-transporting layer (460) was 35 nm of Alq. The OLED of Comparative Example 14 was similar, except that sublayer 442 contained no TPDBP. With respect to the substrate (410), anode (420), hole-injection layer (430), and cathode (470), the OLEDs of Examples 14–17 were the same as for the OLED of Comparative Example 1.

Tables IVa and IVb indicate the percentages of TPDBP and the performance of these devices at 20 mA/cm². Included is the power consumption of the simulated display panel operated at the D60 white point. Again, the luminous yield without a filter was somewhat decreased by the presence of the TPDBP dopant. The drive voltage decreased by a modest amount. The luminous yield with the green and blue filters also decreased, and the CIE coordinates changed somewhat. However, and most importantly, the luminous yield with the red filter increased significantly, and the color with the red filter shifted towards a more saturated red. These examples illustrate that the use of a codoped hole-transporting sublayer according to the present invention has the advantages of increased efficiency with a red filter and a more saturated red color for the red pixels of a multicolor display. Moreover, in the case of Example 15, the predicted power consumption at the D60 white point decreased significantly relative to that for Comparative Example 14. This example illustrates that, by adjusting the composition of the codoped layer within the scope of the present invention, it is possible to achieve a decreased power consumption when a multicolor display is displaying a white color.

The EL spectra of the devices of Examples 14–17 are similar to those of Examples 10–13 as shown in FIG. 8, and they show similar trends. The improved performance of the inventive Examples 15–17 relative to that of Comparative Example 14, when used with a red filter, is believed to be a consequence of an increased red component in the unfiltered spectrum, caused by replacement of the yellow emission of DBzR by the red emission of TPDBP.

TABLE Iva

Composition and performance parameters of the OLEDs
of Examples 14–17
Columns have the same significance as in Table Ia

| Example | % TPDBP | $V_{drive}$ (V) | Yield (cd/A) | CIEx, CIEy |
|---|---|---|---|---|
| 14 | 0 | 9.7 | 5.4 | 0.27, 0.31 |
| 15 | 0.25 | 9.1 | 4.6 | 0.31, 0.30 |
| 16 | 0.50 | 9.3 | 4.3 | 0.32, 0.29 |
| 17 | 0.75 | 9.3 | 3.8 | 0.33, 0.28 |

TABLE Ivb

Photometric properties of the OLEDs of Examples 14–17 measured through
R37 red, G37 green, and B37 blue filters, and predicted power consumption of a
2.2-inch-diagonal square display panel using these OLEDs as the light source

| | Red | | Green | | Blue | | D60 White |
|---|---|---|---|---|---|---|---|
| Example | Yield (cd/A) | CIEx,CIEy | Yield (cd/A) | CIEx,CIEy | Yield (cd/A) | CIEx,CIEy | Power (W) |
| 14 | 1.0 | 0.56,0.33 | 3.6 | 0.28,0.53 | 1.3 | 0.13,0.15 | 2.87 |
| 15 | 1.4 | 0.60,0.33 | 2.7 | 0.29,0.50 | 1.1 | 0.13,0.15 | 2.67 |
| 16 | 1.5 | 0.61,0.33 | 2.4 | 0.29,0.49 | 1.0 | 0.13,0.15 | 2.80 |
| 17 | 1.4 | 0.62,0.32 | 2.0 | 0.29,0.48 | 0.9 | 0.13,0.14 | 3.10 |

Examples 18–19

The OLEDs of Examples 18 and 19 further illustrate the practice of the present invention and the performance of OLEDs constructed according to the present invention. The OLEDs had the structure shown in FIG. 4 and were prepared similarly to the devices of Examples 5 to 9. The hole-transporting layer included a 280 nm thick sublayer of undoped NPB (441) and an approximately 30 nm sublayer (442) of NPB codoped with varying percentages of rubrene as a yellow dopant and 0.5% of TPDBP as a red dopant. The blue light-emitting layer (450) was a 40 nm thick layer of TBADN as host doped with 3% BDTAPVB as a blue dopant and additionally doped with varying percentages of NPB. The electron-transporting layer (460) was 10 nm of Alq. With respect to the substrate (410), anode (420), hole-injection layer (430), and cathode (470), the OLEDs of Examples 18–19 were the same as the OLED of Comparative Example 1.

Tables Va and Vb indicate the percentages of rubrene in the codoped sublayer of the hole-transporting layer and the percentages of NPB in the blue light-emitting layer, along with the performance of these devices at 20 mA/cm$^2$. Included is the power consumption of the simulated display panel operated at the D65 white point.

TABLE Va

Composition and performance parameters of the
OLEDs of Examples 18–19
Column 2 indicates the percentage of rubrene in the
codoped sublayer of the hole-transporting layer (HTL2)
Column 3 indicates the percentage of NPB in the blue
light-emitting layer (EML)
Columns 4–6 have the same significance as
Columns 3–5 of Table Ia

| Example | % rubrene in HTL2 | % NPB in EML | $V_{drive}$ (V) | Yield (cd/A) | CIEx, CIEy |
|---|---|---|---|---|---|
| 18 | 29 | 10 | 8.8 | 10.8 | 0.36, 0.32 |
| 19 | 33 | 5 | 9.1 | 9.6 | 0.43, 0.33 |

TABLE Vb

Photometric properties of the OLEDs of Examples 18–19 measured through
R37 red, G37 green, and B37 blue filters, and predicted power consumption of a
2.2-inch-diagonal square display panel using these OLEDs as the light source

| Example | Red Yield (cd/A) | Red CIEx,CIEy | Green Yield (cd/A) | Green CIEx,CIEy | Blue Yield (cd/A) | Blue CIEx,CIEy | D65 White Power (W) |
|---|---|---|---|---|---|---|---|
| 18 | 3.5 | 0.65,0.35 | 4.6 | 0.25,0.52 | 1.5 | 0.11,0.15 | 1.3 |
| 19 | 3.9 | 0.66,0.34 | 3.4 | 0.31,0.51 | 0.9 | 0.11,0.15 | 1.7 |

The devices of Examples 18 and 19, constructed according to the present invention, show excellent red color when used with the red filter and excellent green and blue colors when used with the green and blue filters. Moreover, the power requirements at the D65 white point are very low. Thus, again, good color quality and high power efficiency can be achieved according to the present invention by codoping a hole-transporting sublayer with both a red and a yellow dopant.

Examples 20–21

The OLED of Example 21 was constructed following the structure of OLED 600 as shown in FIG. 6. The hole-transporting layer included a 130 nm thick sublayer of undoped NPB (641) and a 20 nm sublayer (642) of NPB codoped with 3% of rubrene as a yellow dopant and 0.5% of TPDBP as a red dopant. The blue light-emitting layer (650) was a 20 nm thick layer of TBADN as host doped with 3% BDTAPVB as a blue dopant. The electron-transporting sublayer (661) adjacent to the blue light-emitting layer included a 20 nm thick layer of Alq doped with 0.25% of TPDBP. The electron-transporting sublayer (662) adjacent to the cathode included 15 nm of undoped Alq. With respect to the substrate (610), anode (620), hole-injection layer (630), and cathode (670), the OLED of Example 21 was the same as for the OLED of Comparative Example 1. The OLED of Comparative Example 20 was like that of Example 21 except that it contained no TPDBP. Tables VIa and VIb indicate the performance of these device at 20 mA/cm$^2$.

TABLE VIa

Composition and performance parameters of the
OLEDs of Examples 20–21
Columns 2–4 have the same significance as
Columns 3–5 of Table Ia

| Example | $V_{drive}$ (V) | Yield (cd/A) | CIEx, CIEy |
|---|---|---|---|
| 20 | 8.2 | 5.1 | 0.40, 0.42 |
| 21 | 9.1 | 2.4 | 0.49, 0.33 |

TABLE VIb

Photometric properties of the OLEDs of
Examples 20–21 measured through R37 red,
G37 green, and B37 blue filters

| Example | Red Yield (cd/A) | Red CIEx, CIEy | Green Yield (cd/A) | Green CIEx, CIEy | Blue Yield (cd/A) | Blue CIEx, CIEy |
|---|---|---|---|---|---|---|
| 20 | 1.4 | 0.60, 0.36 | 3.2 | 0.38, 0.55 | 0.49 | 0.14, 0.19 |
| 21 | 1.5 | 0.65, 0.34 | 1.0 | 0.40, 0.46 | 0.23 | 0.12, 0.16 |

Example 21, constructed according to the present invention, showed a decreased luminous yield with no filter and a slightly increased drive voltage relative to Comparative Example 20. Nevertheless, in Example 21 the luminous yield with the red filter was significantly increased, whereas luminous yield with the green and blue filters decreased, relative to Comparative Example 20. The color with the red fitter in Example 21 was also more saturated.

Figure 9:
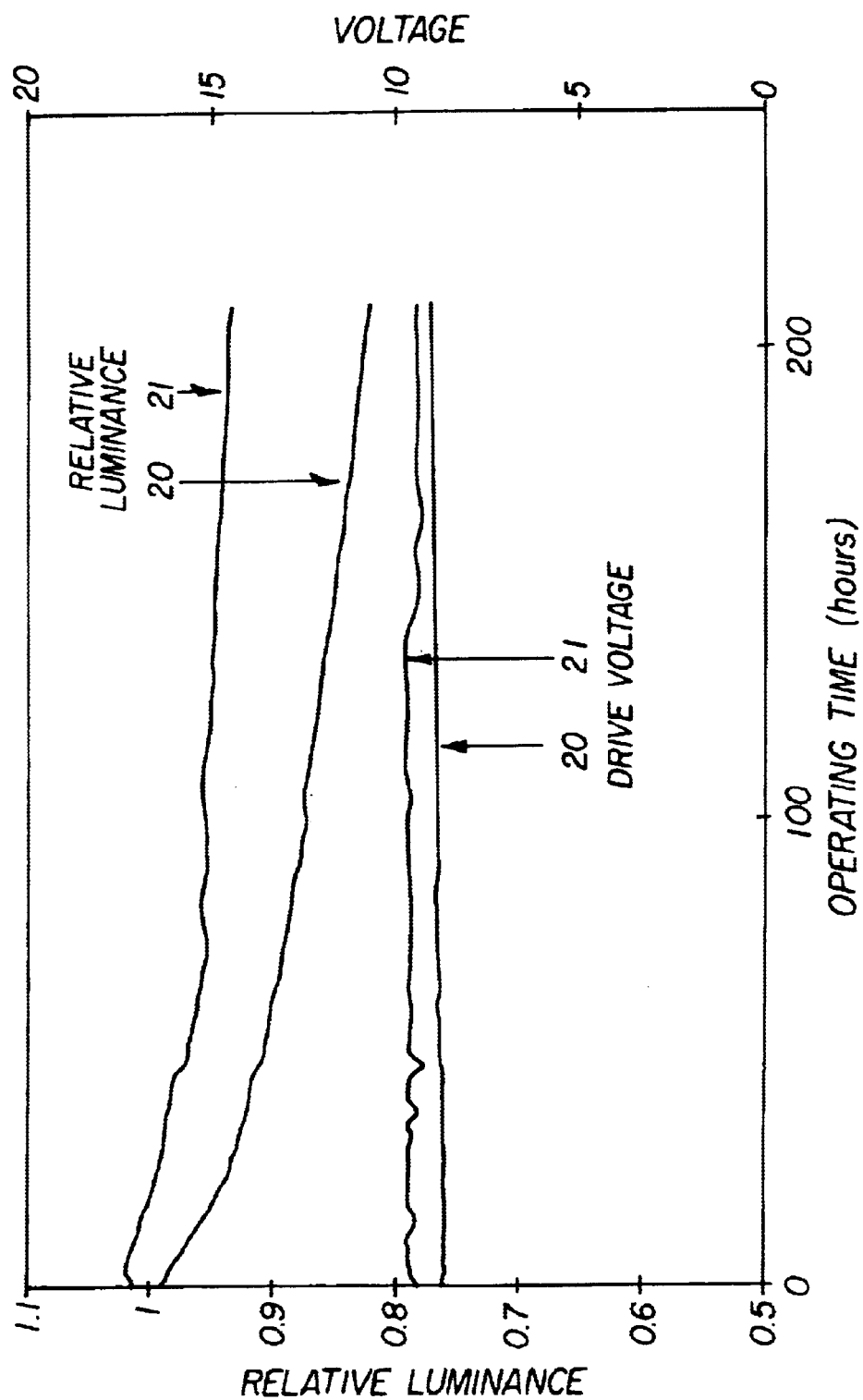
FIG. 9 is a graph showing the drive voltages and relative luminance values for two OLEDs, including a white OLED constructed according to the present invention, as functions of operating time.

The operational stability of the two OLEDs was evaluated by operating them at 20 mA/cm$^2$ and 70° C. FIG. 9 is a plot of the luminance, relative to its initial value, as a function of operating time. FIG. 9 also shows the drive voltage as a function of operating time. In that Figure, the arrows and numerals indicate the relative luminance and drive voltage associated with the respective Examples. The drive voltage for both OLEDs changed by very little in the course of the measurement. However, after 200 hours of operation, the luminance of the OLED of Comparative Example 20 decreased by about 18%, whereas the luminance of the OLED of Example 21 decreased by only about 7%. Therefore, the device of Example 21, which was constructed according to the present invention, exhibited much higher operational stability and longer device lifetime than the control device of Example 20.

Example 22

The OLED of this example was constructed following the structure of OLED 600 as shown in FIG. 6. The hole-transporting layer included a 240 nm thick sublayer of undoped NPB (641) and a 26 nm thick sublayer (642) of NPB codoped with 28% of rubrene as a yellow dopant and 0.5% of TPDBP as a red dopant. The blue light-emitting layer (650) was a 30 nm thick layer of TBADN as host doped with 0.75% of the compound shown in Formula XVI as a blue dopant and additionally doped with 5% of NPB. The electron-transporting sublayer (661) adjacent to the blue light-emitting layer included a 15 nm thick layer of Alq doped with 0.5% of DPQA. The electron-transporting sublayer (662) adjacent to the cathode included 5 nm of undoped Alq. With respect to the substrate (610), anode (620), hole-injection layer (630), and cathode (670), the OLEDs of Example 22 was the same as for the OLED of Comparative Example 1.

Tables VIIa and VIIb indicate the performance of this device at 20 mA/cm$^2$, including the power consumption of the simulated display panel operated at the D65 white point.

TABLE VIIa

Performance parameters of the OLED of Example 22

| $V_{drive}$ (V) | Yield (cd/A) | CIEx, CIEy |
|---|---|---|
| 10.6 | 5.4 | 0.32, 0.26 |

TABLE VIIb

Photometric properties of the OLED of Example 22 measured through R37 red, G37 green, and B37 blue filters, and predicted power consumption

| Red | | Green | | Blue | | D65 White |
|---|---|---|---|---|---|---|
| Yield (cd/A) | CIEx, CIEy | Yield (cd/A) | CIEx, CIEy | Yield (cd/A) | CIEx, CIEy | Power (W) |
| 2.0 | 0.65, 0.35 | 2.4 | 0.29, 0.54 | 0.6 | 0.14, 0.08 | 2.0 |

When used with the red, green, and blue filters, the device of Example 22 constructed according to the present invention showed good colors and good efficiencies.

The invention has been described in detail with particular reference to certain preferred embodiments thereof, but it will be understood that variations and modifications can be effected within the spirit and scope of the invention. For example, one or more additional dopant(s) can be used in any of the hole-transporting, electron-transporting or light-emitting layers.

PARTS LIST

100 OLED with a simple structure
110 substrate
120 anode
140 light-emitting layer
170 cathode
200 OLED with a multilayer structure
210 substrate
220 anode
230 hole-injecting layer
240 hole-transporting layer
250 light-emitting layer
260 electron-transporting layer
270 cathode
300 OLED
310 substrate
320 anode
330 hole-injecting layer
340 hole-transporting layer
350 light-emitting layer
360 electron-transporting layer
370 cathode
400 OLED
410 substrate
420 anode
430 hole-injecting layer
440 hole-transporting layer
441 hole-transporting sublayer
442 hole-transporting sublayer
450 light-emitting layer

What is claimed is:

1. An organic light-emitting diode (OLED) device that produces white light, including:
    a) an anode;
    b) a hole-transporting layer disposed over the anode;
    c) a blue light-emitting layer disposed over the hole-transporting layer;
    d) an electron-transporting layer disposed over the blue light-emitting layer,
    e) a cathode disposed over the electron-transporting layer; and
    f) the hole-transporting layer including a host material, a yellow dopant, and a red dopant.

2. The OLED of claim 1 wherein the blue light-emitting layer includes a host material and a blue dopant.

3. The OLED of claim 2 wherein the host material in the blue light-emitting layer includes an anthracene derivative having hydrocarbon or substituted-hydrocarbon substituents at the 9 and 10 positions.

4. The OLED of claim 2 wherein the host material includes 9,10-di-(2-naphthyl)anthracene (ADN) or 2-t-butyl-9,10-di-(2-naphthyl)anthracene (TBADN).

5. The OLED of claim 2 wherein the blue dopant includes perylene or a derivative of perylene.

6. The OLED of claim 2 wherein the blue dopant includes 2,5,8,11-tetra-t-butyl perylene (TBP).

7. The OLED of claim 2 wherein the blue dopant includes a blue-emitting derivative of a distyrylbenzene or a distyryl-biphenyl.

8. The OLED of claim 2 wherein the blue dopant includes a bis[2-[4-[N,N-diarylamino]phenyl]vinyl]arene.

9. The OLED of claim 2 wherein the blue dopant includes 1,4-bis[2-[4-[N,N-di(p-tolyl)amino]phenyl]vinyl]benzene (BDTAPVB).

10. The OLED of claim 2 wherein the blue dopant includes a compound of the structure

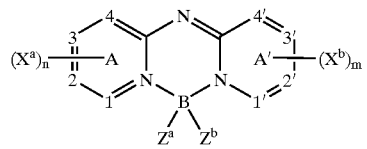

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and provided that $X^a$, $X^b$, $Z^a$, and $Z^b$, 1, 2, 3, 4, 1', 2', 3', and 4' are selected to provide blue luminescence.

11. The OLED of claim 2 wherein the blue dopant includes a compound of the structure:

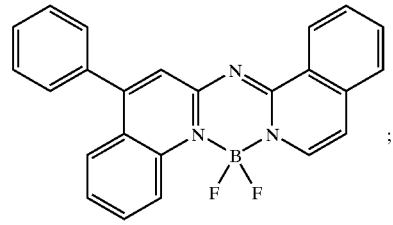

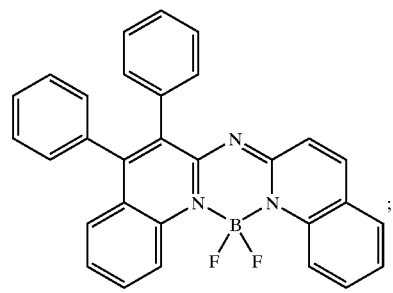

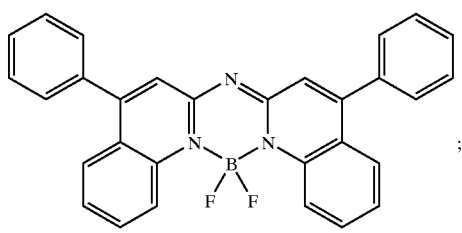

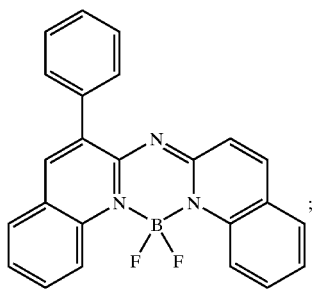

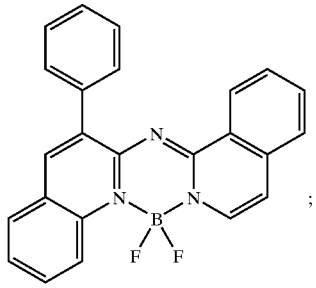

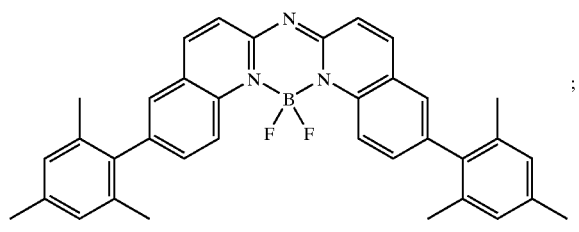

or

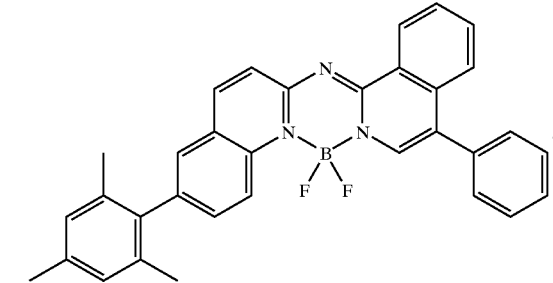

12. The OLED of claim 2 wherein the blue dopant includes a compound of the structure:

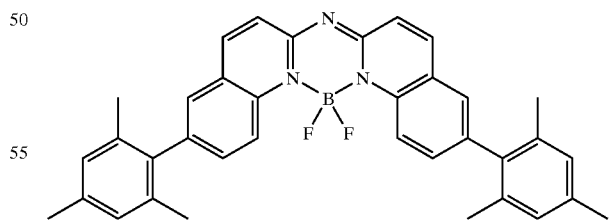

13. The OLED of claim 2 wherein the blue dopant is between 0.1 and 10% by volume of the blue light-emitting layer.

14. The OLED of claim 1 wherein the blue light-emitting layer includes a triarylamine dopant.

15. The OLED of claim 1 wherein the blue light-emitting layer includes NPB or TNB as a dopant.

16. The OLED of claim 1 wherein the hole-transporting layer includes a tertiary aromatic amine.

17. The OLED of claim 1 wherein the yellow dopant includes a compound of the following structure:

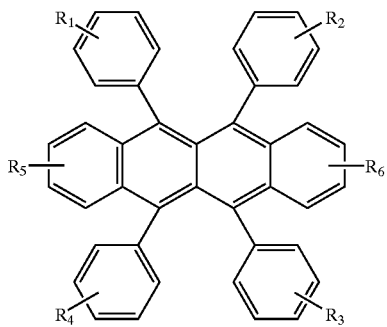

wherein $R_1$–$R_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxyamino, alkylamino, or arylamino of from 1 to 24 carbon atoms; or Category 6: fluoro, chloro, bromo or cyano.

18. The OLED of claim 1 wherein the yellow dopant includes 5,6,11,12-tetraphenylnaphthacene (rubrene); 6,11-diphenyl-5,12-bis(4-(6-methyl-benzothiazol-2-yl)phenyl) naphthacene (DBzR); or 5,6,11,12-tetra(2-naphthyl) naphthacene (NR).

19. The OLED of claim 1 wherein the red dopant includes a diindenoperylene compound of the following structure:

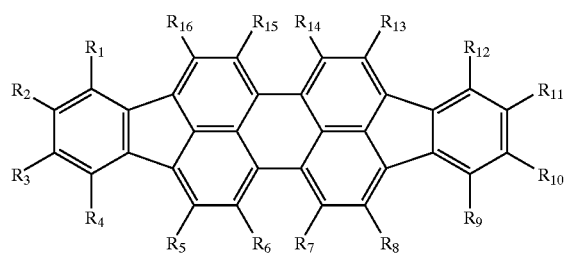

wherein $R_1$–$R_6$ are independently selected as hydro or substituents that provide red luminescence.

20. The OLED of claim 1 wherein the red dopant includes:

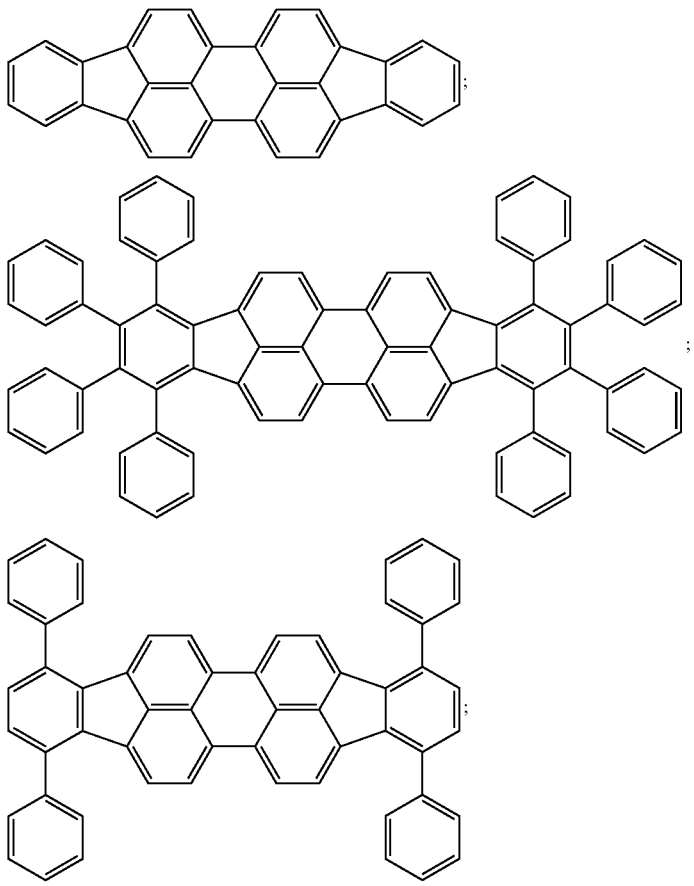

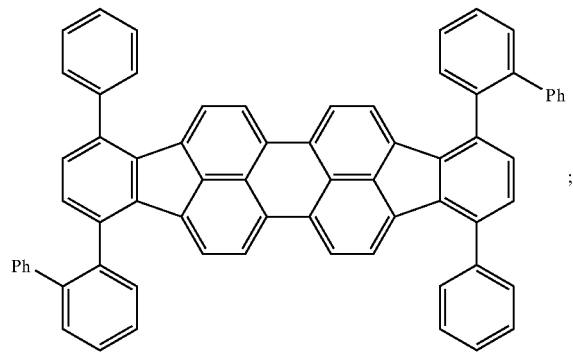
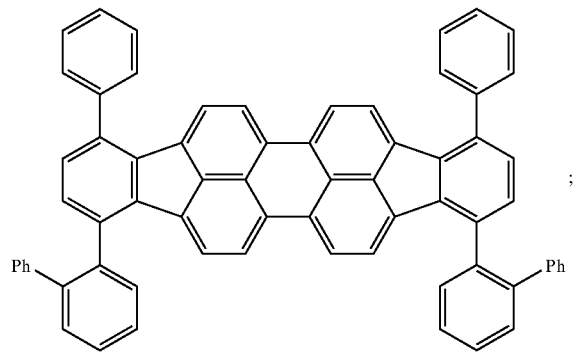
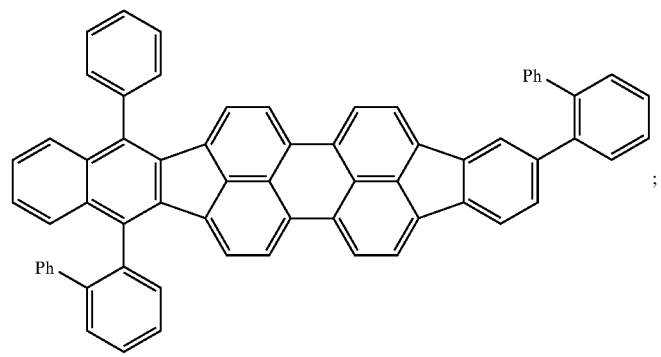
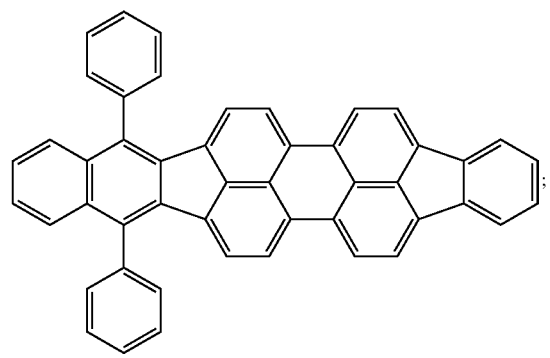

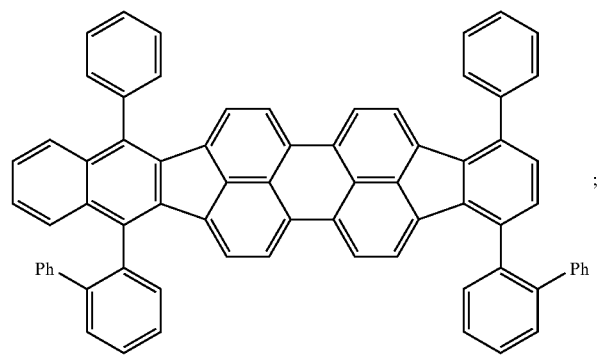
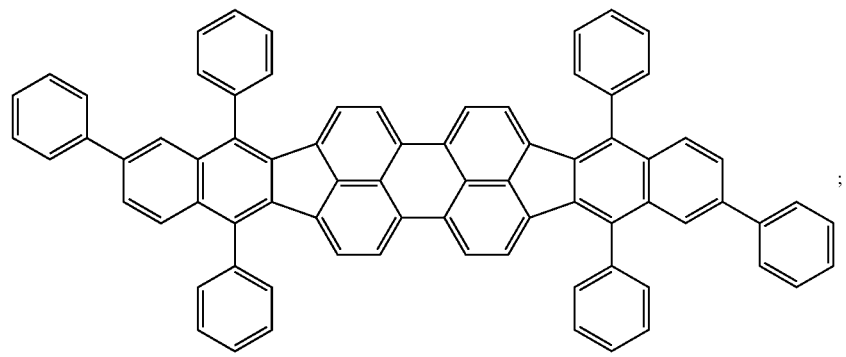
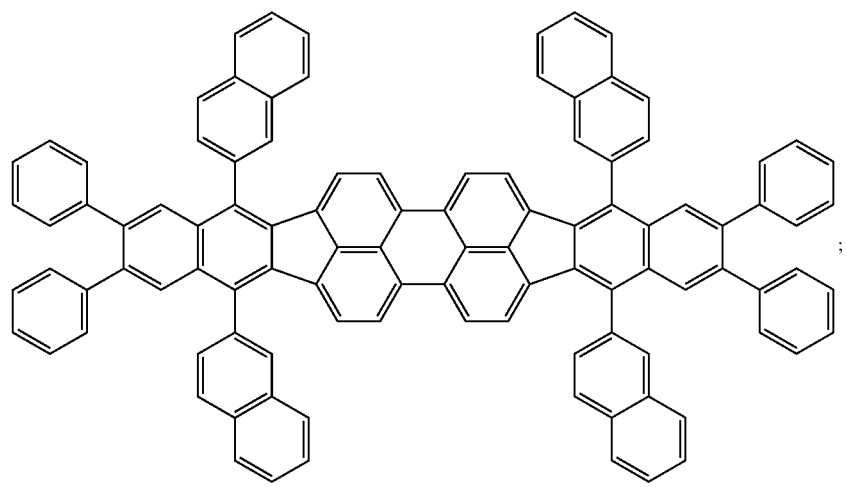
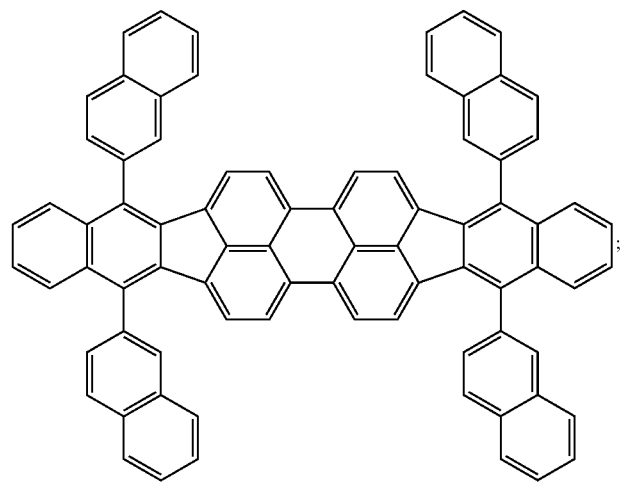

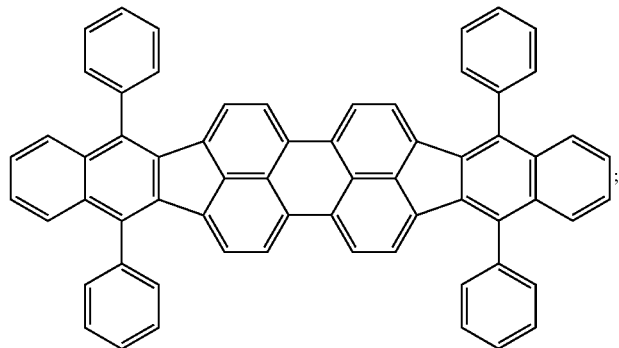
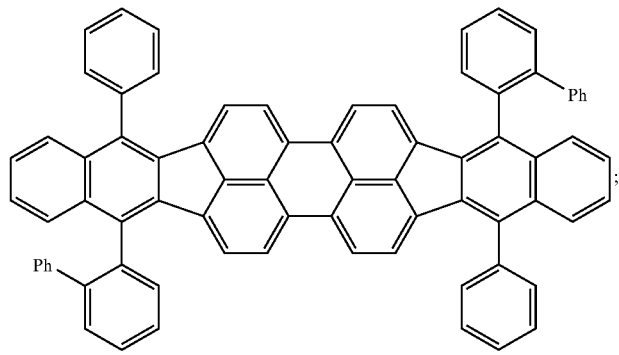
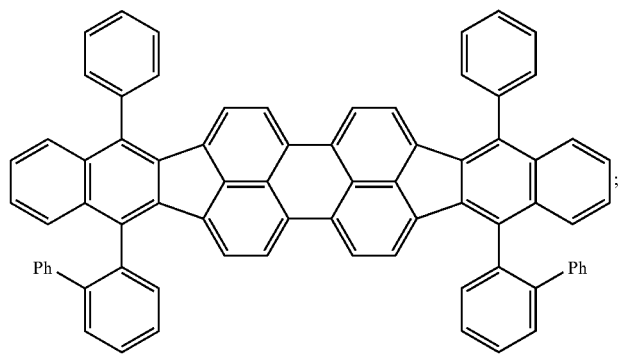
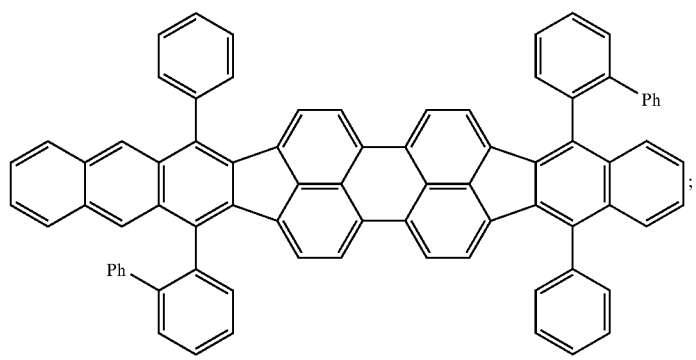

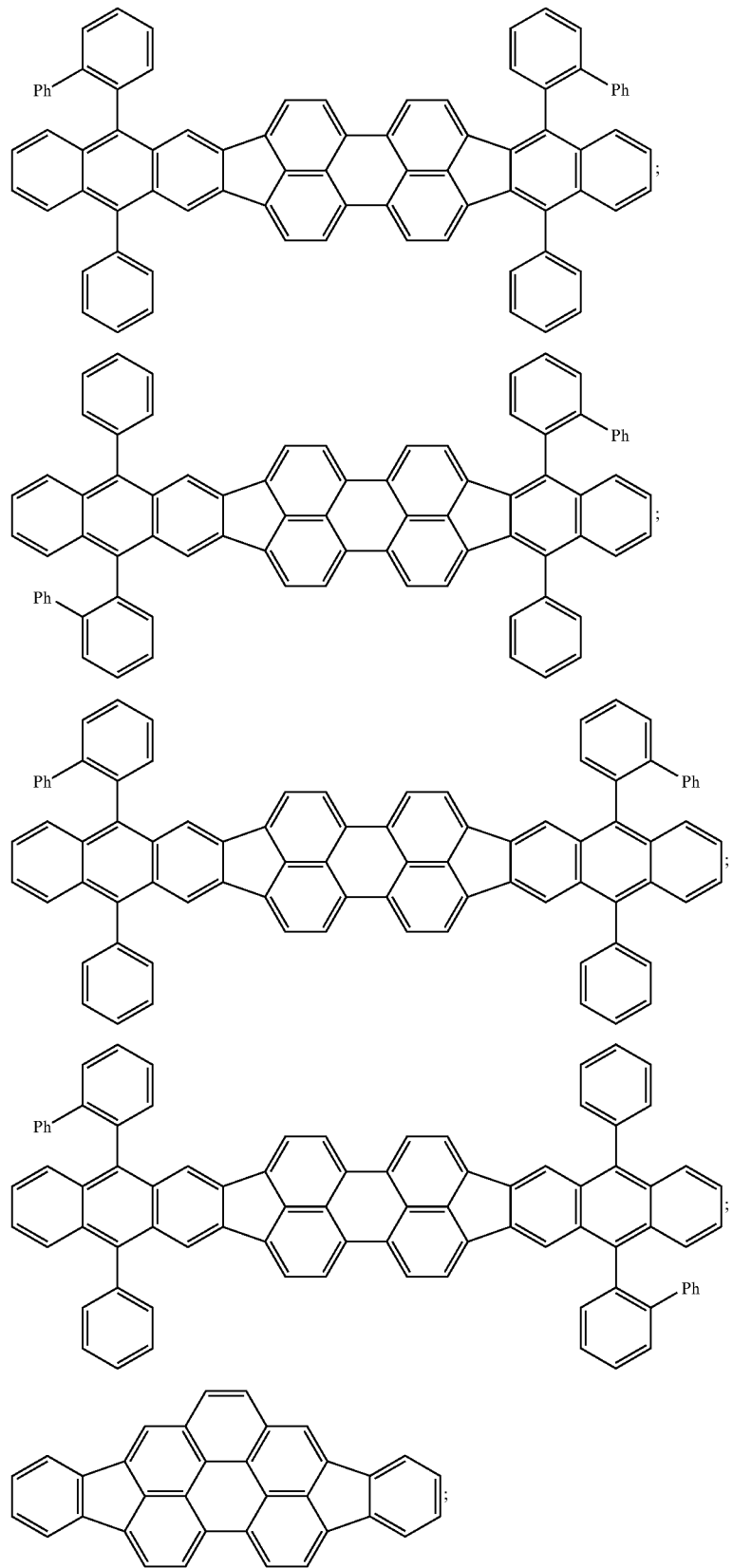

-continued
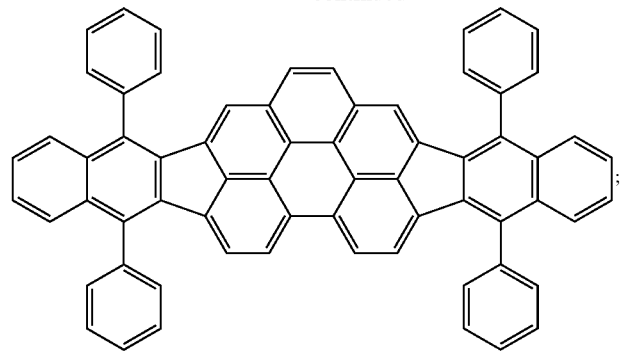
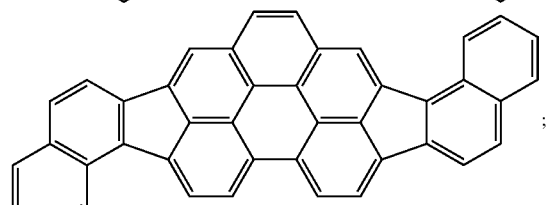
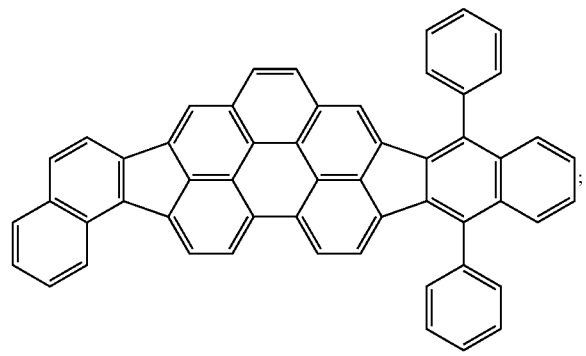
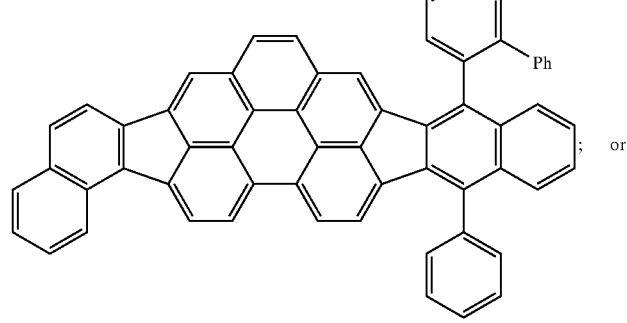; or
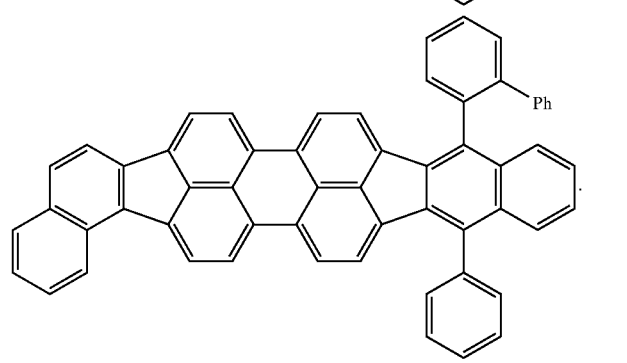

21. The OLED of claim 1 wherein the red dopant compound includes TPDBP.

22. The OLED of claim 1 wherein the red dopant includes a compound of the following structure:

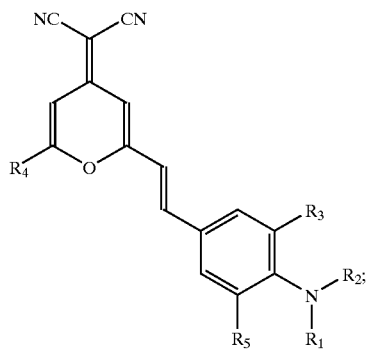

wherein:

$R_1$–$R_5$ represent one or more groups selected independently from: hydro, alkyl, substituted alkyl, aryl, or substituted aryl;

$R_1$–$R_5$ independently include acyclic groups or are joined pairwise to form one or more fused rings;

provided that $R_3$ and $R_5$ do not together form a fused ring; and $R_1$–$R_5$ are selected to provide red luminescence.

23. The OLED of claim 1 wherein the red dopant includes:

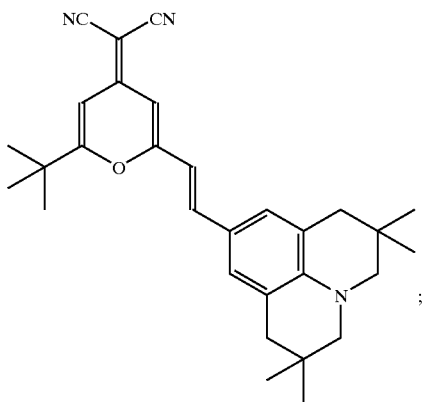

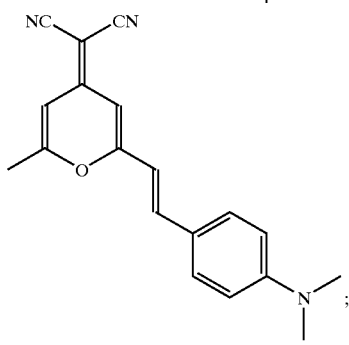

-continued

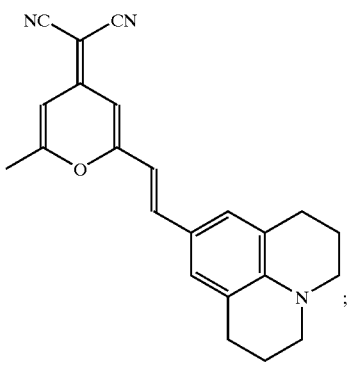

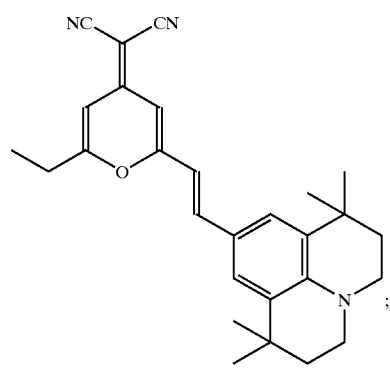

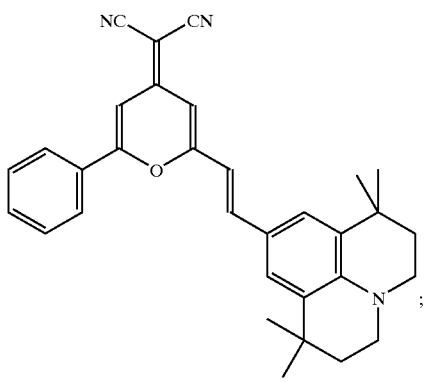

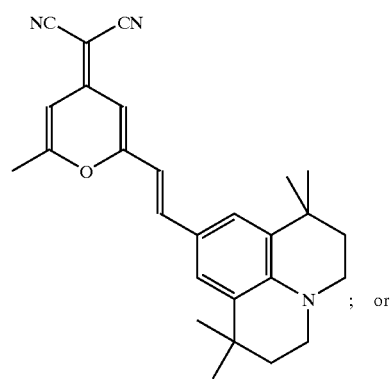

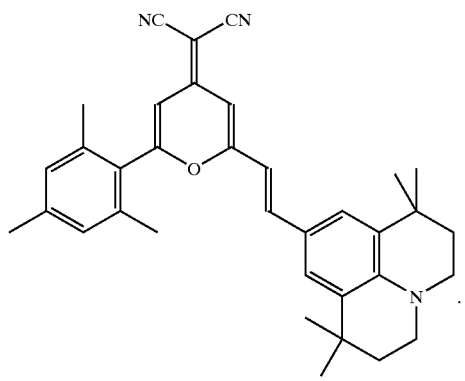

24. The OLED of claim 1 wherein the red dopant is DCJTB.

25. The OLED of claim 1 wherein the yellow dopant is between 0.5 and 50% by volume of the hole-transporting layer.

26. The OLED of claim 1 wherein the red dopant is between 0.1 and 5% by volume of the hole-transporting layer.

27. The OLED of claim 1 wherein the hole-transporting layer includes two or more hole-transporting sub layers, the sublayer closest to the blue light-emitting layer including a host material, a yellow dopant, and a red dopant; and the sublayer closest to the anode not containing the yellow dopant or not containing the red dopant.

28. The OLED of claim 27 wherein the concentration of the yellow dopant is between 0.5 and 50% by volume of the hole-transporting sublayer that is closest to the blue light-emitting layer.

29. The OLED of claim 27 wherein the concentration of the red dopant is between 0.1 and 5% by volume of the hole-transporting sublayer that is closest to the blue light-emitting layer.

30. The OLED of claim 1 wherein the electron-transporting layer includes a green dopant.

31. The OLED of claim 1 wherein the electron-transporting layer includes a coumarin compound.

32. The OLED of claim 1 wherein the electron-transporting layer includes C545T.

33. The OLED of claim 1 wherein the electron-transporting layer includes a quniacridone.

34. The OLED of claim 1 wherein the electron-transporting layer includes:

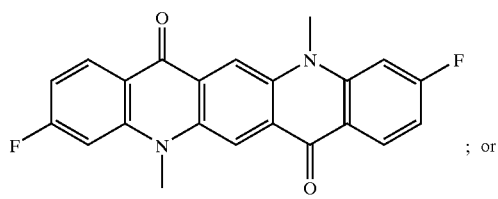

; or

35. The OLED of claim 1 wherein the electron-transporting layer includes:

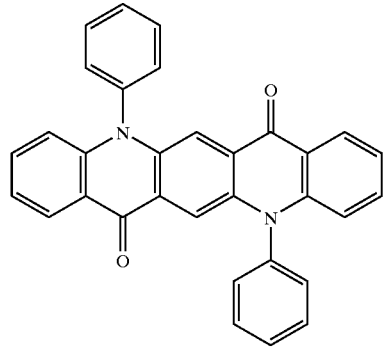

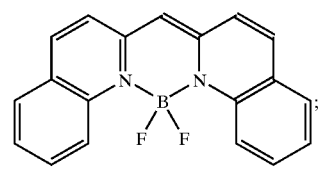

;

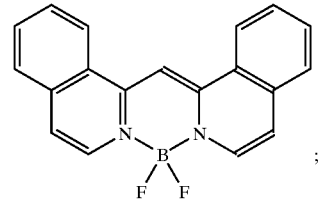

;

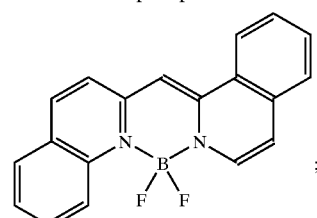

;

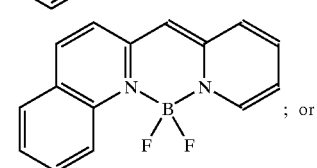

; or

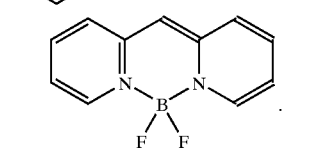

.

36. The OLED of claim 1 wherein the electron-transporting layer includes two or more electron-transporting sublayers, the sublayer adjacent to the blue light-emitting layer including a green dopant, and the sublayer adjacent to the cathode not containing the green dopant.

37. The OLED of claim 1 wherein the electron-transporting layer includes a red dopant.

38. The OLED of claim 1 wherein the electron-transporting layer includes a diindenoperylene compound of the following structure:

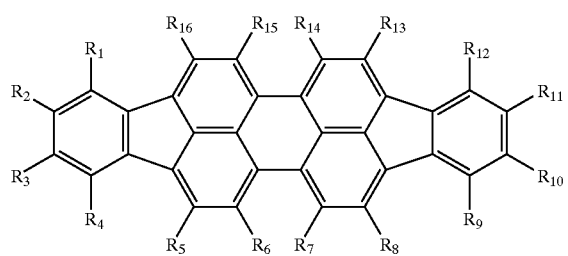
wherein:
R$_1$–R$_{16}$ are independently selected as hydrogen or substituents that provide red luminescence.
39. The OLED of claim 1 wherein the electron-transporting layer includes:
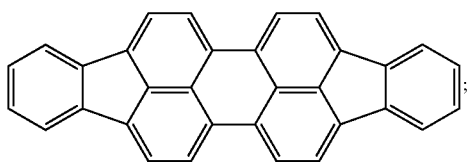
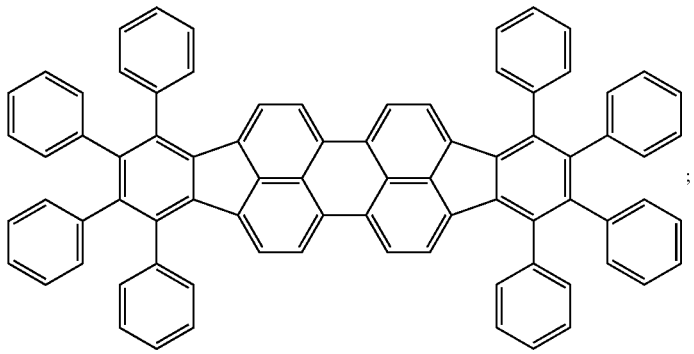
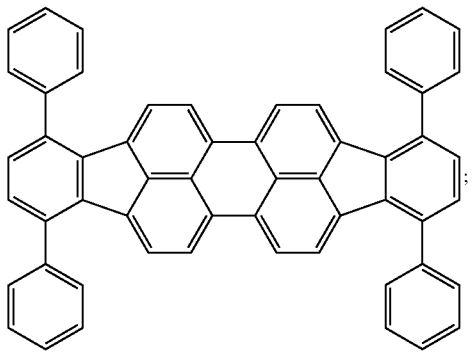
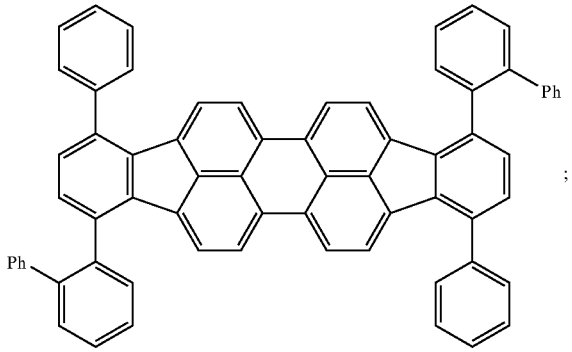

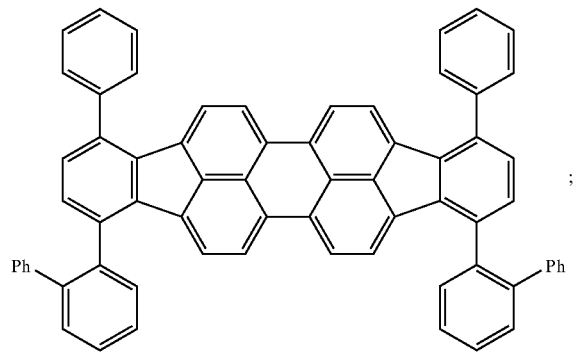
;
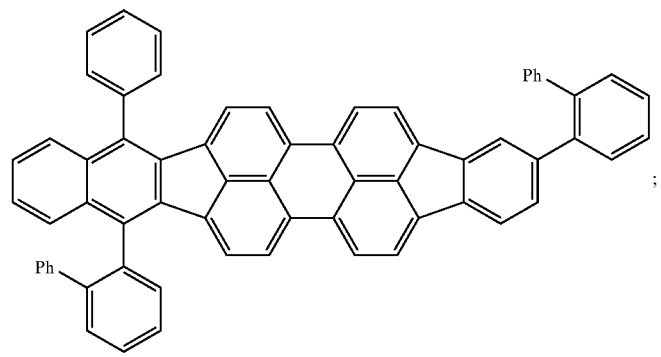
;
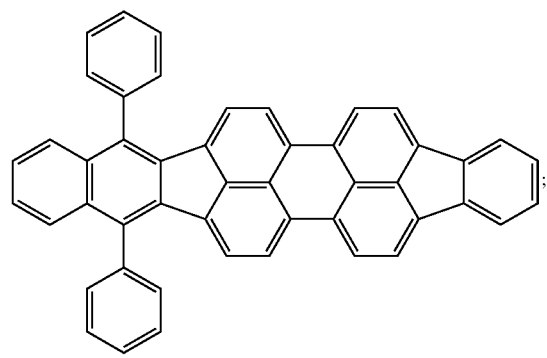
;
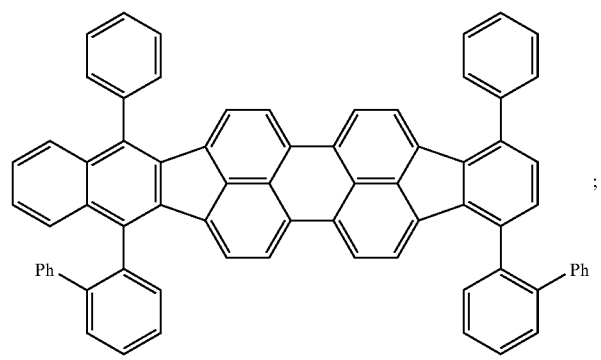
;

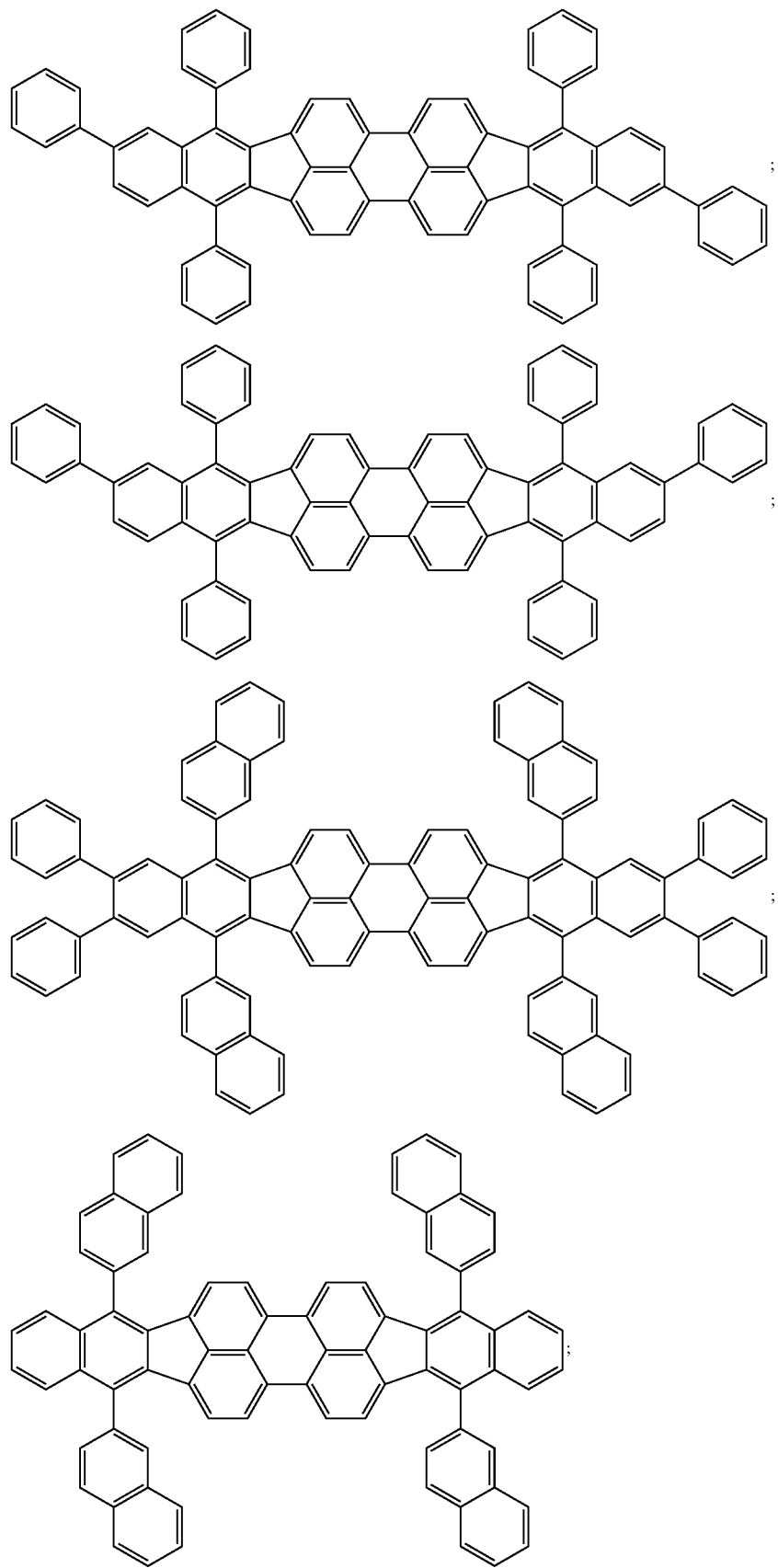

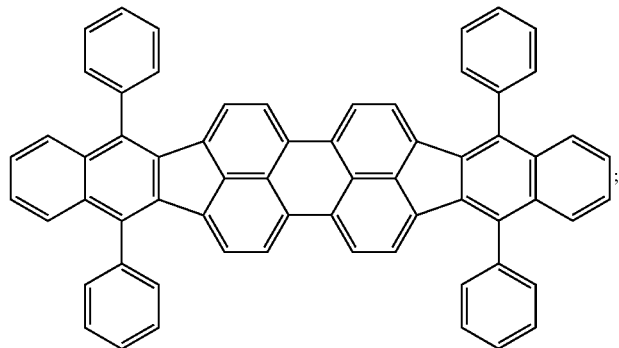
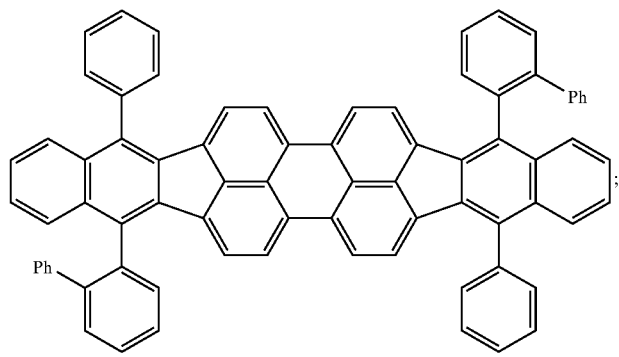
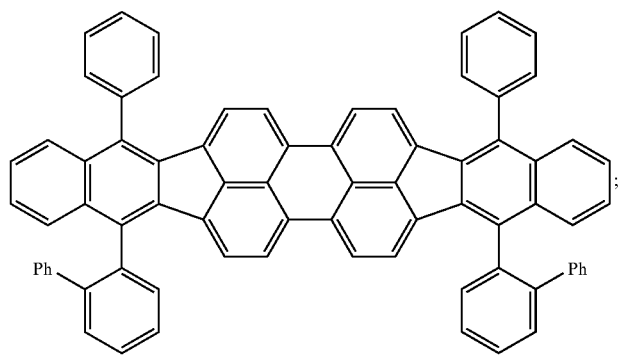
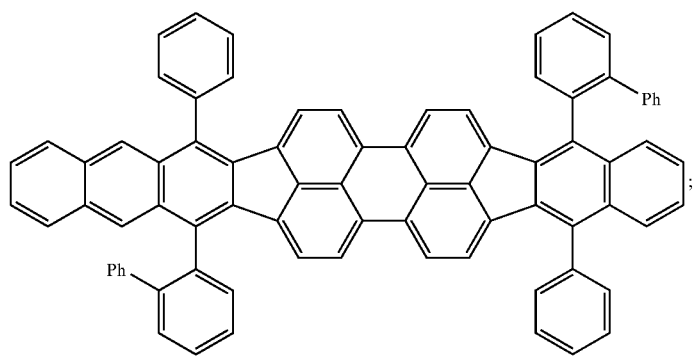

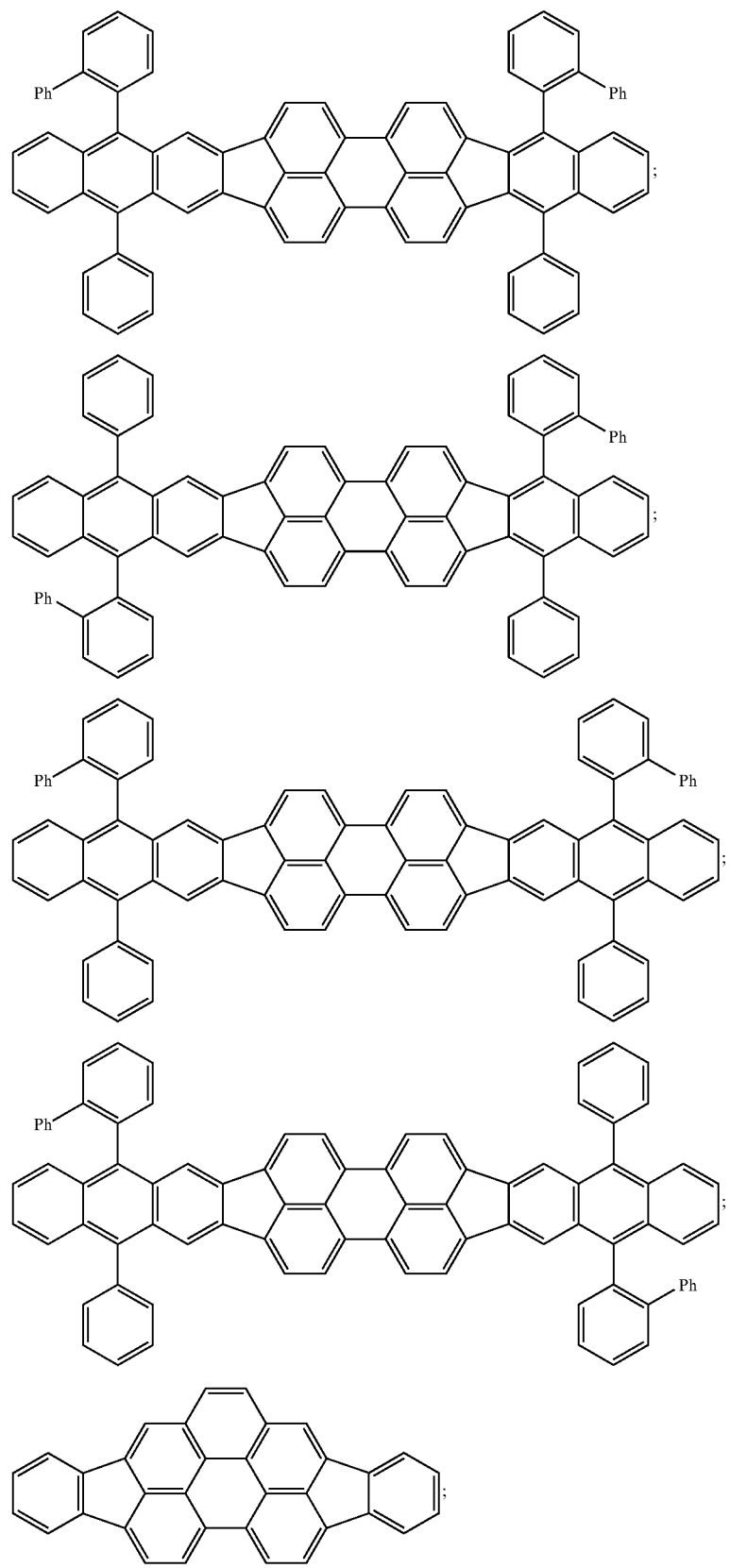

-continued
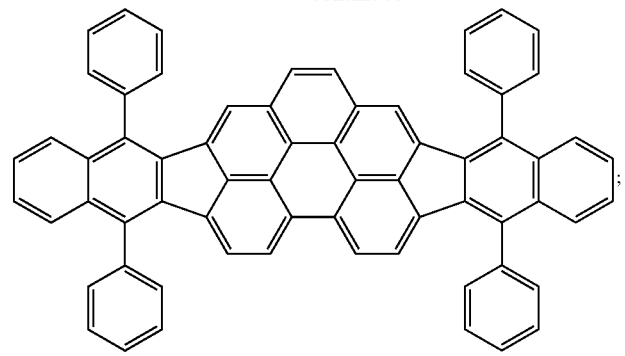;
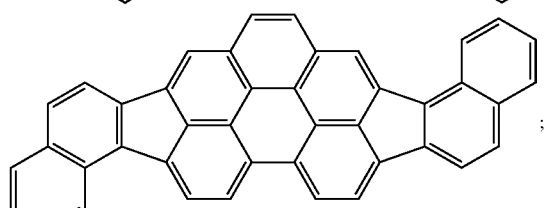;
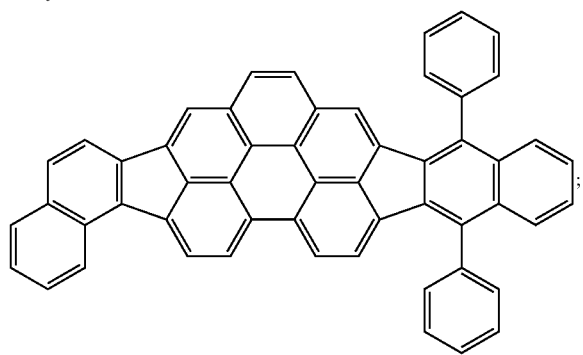;
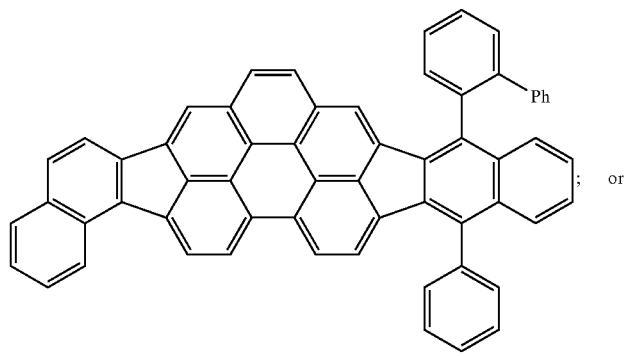; or
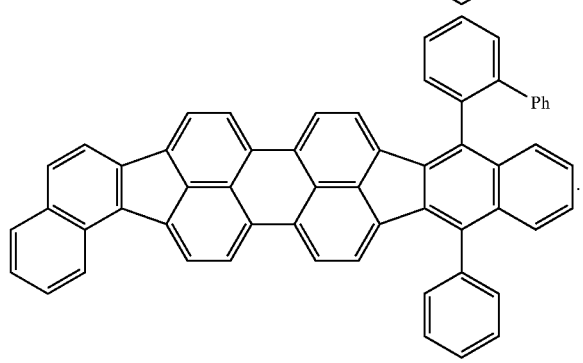.

40. The OLED of claim 1 wherein the electron-transporting layer includes TPDBP.

41. The OLED of claim 1 wherein the electron-transporting layer includes a compound of the following structure:

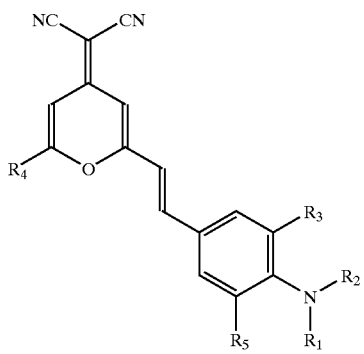

wherein:

$R_1$–$R_5$ represent one or more groups selected independently from: hydro, alkyl, substituted alkyl, aryl, or substituted aryl;

$R_1$–$R_5$ independently include acyclic groups or are joined pairwise to form one or more fused rings;

provided that $R_3$ and $R_5$ do not together form a fused ring; and $R_1$–$R_5$ are selected to provide red luminescence.

42. The OLED of claim 1 wherein the electron-transporting layer includes:

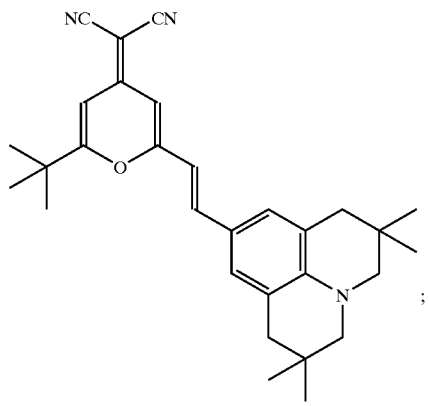

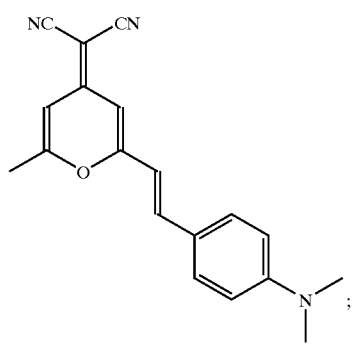

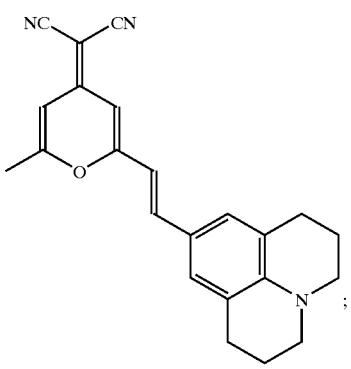

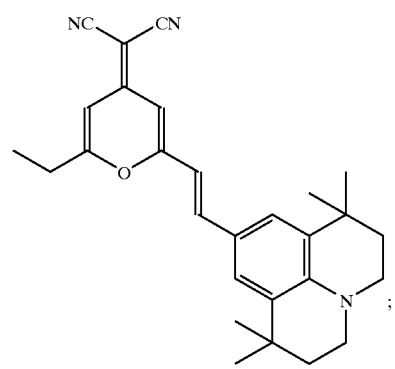

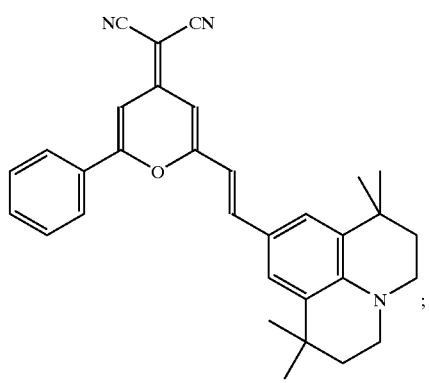

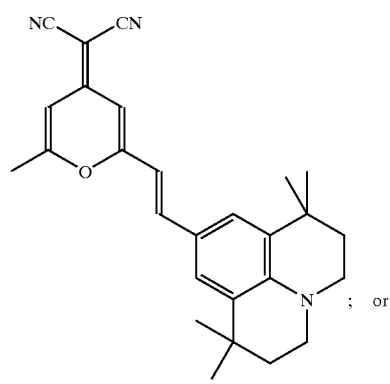

-continued

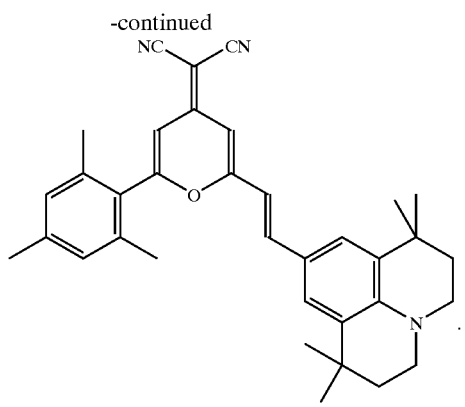

43. The OLED of claim 1 wherein the electron-transporting layer includes DCJTB.

44. A light-emitting display including:
a) a plurality of OLEDs that produce white light when current is driven through them, each OLED including:
   i) an anode;
   ii) a hole-transporting layer disposed over the anode;
   iii) a blue light-emitting layer disposed over the hole-transporting layer;
   iv) an electron-transporting layer disposed over the blue light-emitting layer;
   v) a cathode disposed over the electron-transporting layer; and
   vi) the hole-transporting layer including a host material, a yellow dopant and a red dopant; and
b) an array of color filters, including red, green, and blue filters, disposed in the display, each filter corresponding to a different OLED such that the white light produced by each OLED is filtered by its corresponding filter.

45. The display of claim 44 further including a substrate, wherein the color filter array is disposed above the substrate and the anode is disposed above the color filter array, or wherein the anode is disposed over the substrate and the color filter array is disposed above the cathode.

46. A light-emitting display including:
a) one or more OLEDs that produce white light upon passage of electrical current through the OLED(s), each OLED including:
   i) an anode;
   ii) a hole-transporting layer disposed over the anode;
   iii) a blue light-emitting layer disposed over the hole-transporting layer;
   iv) an electron-transporting layer disposed over the blue light-emitting layer;
   v) a cathode disposed over the electron-transporting layer; and
   vi) the hole-transporting layer including a host material, a yellow dopant and a red dopant; and
b) an array of color filters, including red, green, and blue filters, disposed in the display such that the white light produced by the OLED(s) is filtered through the color filters; and
c) an array of liquid-crystal light valves, each light valve corresponding to a different color filter, disposed in the array such that the white light produced by the OLED(s) and filtered by the color filter is adjusted in brightness by the liquid-crystal light valves.

* * * * *